United States Patent
Lin et al.

(10) Patent No.: US 11,139,290 B2
(45) Date of Patent: Oct. 5, 2021

(54) HIGH VOLTAGE CASCODE HEMT DEVICE

(71) Applicant: Taiwan Semiconductor Manufacturing Co., Ltd., Hsin-Chu (TW)

(72) Inventors: Ming-Cheng Lin, Yilan (TW); Chen-Bau Wu, Zhubei (TW); Chun Lin Tsai, Hsin-Chu (TW); Haw-Yun Wu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/534,259

(22) Filed: Aug. 7, 2019

(65) Prior Publication Data

US 2020/0105741 A1 Apr. 2, 2020

Related U.S. Application Data

(60) Provisional application No. 62/738,178, filed on Sep. 28, 2018.

(51) Int. Cl.
| | |
|---|---|
| *H01L 27/06* | (2006.01) |
| *H01L 29/778* | (2006.01) |
| *H01L 25/07* | (2006.01) |
| *H01L 29/66* | (2006.01) |
| *H01L 21/761* | (2006.01) |

(52) U.S. Cl.
CPC ........ *H01L 27/0629* (2013.01); *H01L 21/761* (2013.01); *H01L 25/072* (2013.01); *H01L 29/66431* (2013.01); *H01L 29/7786* (2013.01)

(58) Field of Classification Search
CPC .......... H01L 29/66431; H01L 29/7786; H01L 29/66462; H01L 21/761
See application file for complete search history.

(56) References Cited

U.S. PATENT DOCUMENTS

| | | | | |
|---|---|---|---|---|
| 4,635,343 | A | * 1/1987 | Kuroda | ............. H01L 21/30621 257/E21.222 |
| 5,012,318 | A | * 4/1991 | Honjo | ................. H01L 27/0605 257/195 |
| 5,140,392 | A | 8/1992 | Ikemasu | |

(Continued)

OTHER PUBLICATIONS

Shodhganga : A Reservoir of Indian Theses "CMOS Cascode Amplifiers." The date of publication is unknown. Retrieved online on Sep. 25, 2018 from https://shodhganga.inflibnet.ac.in/bitstream/10603/84144/14/14_chapter4.pdf.

(Continued)

*Primary Examiner* — Victoria K. Hall
(74) *Attorney, Agent, or Firm* — Eschweiler & Potashnik, LLC

(57) ABSTRACT

The present disclosure relates to a semiconductor device including a first high electron mobility transistor (HEMT) device disposed within a semiconductor structure and having a first source, a first drain, and a first gate; a second HEMT device disposed within the semiconductor structure and having a second source, a second drain, and a second gate, the second source coupled to the first drain; and a diode-connected transistor device disposed within the semiconductor structure and comprising a third source, a third gate, and a third drain, the third drain coupled to the second gate.

20 Claims, 16 Drawing Sheets

(56) References Cited

U.S. PATENT DOCUMENTS

| | | | | |
|---|---|---|---|---|
| 5,293,084 | A * | 3/1994 | Itoh | H01L 27/0605 257/195 |
| 5,302,840 | A * | 4/1994 | Takikawa | H01L 27/0605 257/11 |
| 5,387,880 | A * | 2/1995 | Kobayashi | H03F 1/226 330/277 |
| 5,422,501 | A * | 6/1995 | Bayraktaroglu | H01L 27/0605 257/195 |
| 5,567,961 | A * | 10/1996 | Usagawa | H01L 27/0605 257/197 |
| 5,739,559 | A * | 4/1998 | Kagaya | H01L 29/1075 257/192 |
| 6,043,519 | A * | 3/2000 | Shealy | H01L 21/8252 257/192 |
| 6,114,901 | A * | 9/2000 | Singh | G05F 3/205 327/543 |
| 6,747,484 | B1 * | 6/2004 | Adlerstein | H03G 11/04 327/172 |
| 7,238,986 | B2 * | 7/2007 | Pendharkar | H01L 29/0847 257/336 |
| 7,514,329 | B2 * | 4/2009 | Pendharkar | H01L 29/0847 438/286 |
| 8,541,815 | B2 | 9/2013 | Takemae et al. | |
| 9,263,439 | B2 * | 2/2016 | Zhang | H01L 29/872 |
| 9,356,017 | B1 * | 5/2016 | Siemieniec | H01L 27/0629 |
| 9,590,494 | B1 * | 3/2017 | Zhou | H02M 7/219 |
| 9,857,818 | B1 * | 1/2018 | Adamski | H03F 1/0233 |
| 9,882,020 | B2 | 1/2018 | Padmanabhan et al. | |
| 10,276,657 | B2 * | 4/2019 | Yao | H01L 27/085 |
| 10,630,285 | B1 * | 4/2020 | Cuadra | H03K 17/162 |
| 10,700,650 | B1 * | 6/2020 | Ayranci | H03F 1/223 |
| 10,991,722 | B2 * | 4/2021 | Lee | H01L 27/1203 |
| 2005/0253191 | A1 * | 11/2005 | Pendharkar | H01L 29/66659 257/335 |
| 2008/0230784 | A1 * | 9/2008 | Murphy | H03K 17/567 257/76 |
| 2012/0098035 | A1 * | 4/2012 | Bahl | H01L 29/7787 257/194 |
| 2012/0098036 | A1 * | 4/2012 | Bahl | H01L 29/0661 257/194 |
| 2012/0098037 | A1 * | 4/2012 | Chang | H01L 29/41766 257/194 |
| 2012/0153300 | A1 * | 6/2012 | Lidow | H01L 29/1075 257/77 |
| 2012/0235209 | A1 * | 9/2012 | Briere | H01L 27/0605 257/194 |
| 2012/0319758 | A1 * | 12/2012 | Kobayashi | H01L 21/8249 327/432 |
| 2013/0009165 | A1 * | 1/2013 | Park | H01L 27/0629 257/76 |
| 2013/0020614 | A1 | 1/2013 | Lu et al. | |
| 2013/0161638 | A1 * | 6/2013 | Yao | H01L 29/7787 257/76 |
| 2013/0193512 | A1 | 8/2013 | Weis | |
| 2013/0240893 | A1 * | 9/2013 | Bedell | H01L 29/66462 257/76 |
| 2013/0271208 | A1 | 10/2013 | Then et al. | |
| 2014/0049296 | A1 * | 2/2014 | Jeon | H03K 3/012 327/109 |
| 2014/0225162 | A1 * | 8/2014 | Briere | H01L 27/085 257/195 |
| 2015/0162321 | A1 * | 6/2015 | Briere | H03K 17/102 257/195 |
| 2017/0062482 | A1 * | 3/2017 | Yamazaki | H01L 27/1207 |
| 2017/0271327 | A1 | 9/2017 | Jiang | |
| 2017/0278874 | A1 * | 9/2017 | Yamazaki | H01L 29/7782 |
| 2018/0026029 | A1 * | 1/2018 | Lin | H01L 28/20 361/56 |
| 2019/0081137 | A1 * | 3/2019 | Yao | H01L 29/66462 |
| 2019/0115339 | A1 * | 4/2019 | Lai | H01L 29/7787 |
| 2019/0115459 | A1 * | 4/2019 | Kim | H01L 29/165 |
| 2020/0186047 | A1 * | 6/2020 | Sen | H02M 3/3376 |
| 2020/0295045 | A1 * | 9/2020 | Lee | H01L 21/84 |

OTHER PUBLICATIONS

Colino et al. "Fundamentals of Gallium Nitride Power Transistors." EPC—Efficient Power Conversion Corporation. Published in 2011.

Najmabadi, F. "Cascode Amplifiers and Cascode Current Mirrors." Sedra & Smith Sec. 7 (MOS portion) (S&S 5th Ed: Sec. 6 MOS portion & ignore frequency response), published in 2012.

Lidow et al. "GaN Transistors for Efficient Power Conversion—Chapter I: Gallium Nitride (GaN) Technology Overview." ISBN: 978-1-118-84476-2, published Sep. 2014.

Davis, Sam. "GaN Basics FAQs." Power Electronics, published on Oct. 2, 2013.

* cited by examiner

HIGH VOLTAGE CASCODE HEMT DEVICE

REFERENCE TO RELATED APPLICATION

This Application claims the benefit of U.S. Provisional Application No. 62/738,178, filed on Sep. 28, 2018, the contents of which are hereby incorporated by reference in their entirety.

BACKGROUND

Modern day integrated chips comprise millions or billions of semiconductor devices formed on a semiconductor substrate (e.g., silicon). Integrated chips (ICs) may use many different types of transistor devices, depending on an application of an IC. In recent years, the increasing market for cellular and RF (radio frequency) devices has resulted in a significant increase in the use of high voltage transistor devices. For example, high voltage transistor devices are often used in power amplifiers in RF transmission/receiving chains due to their ability to handle high breakdown voltages (e.g., greater than about 50V) and high frequencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
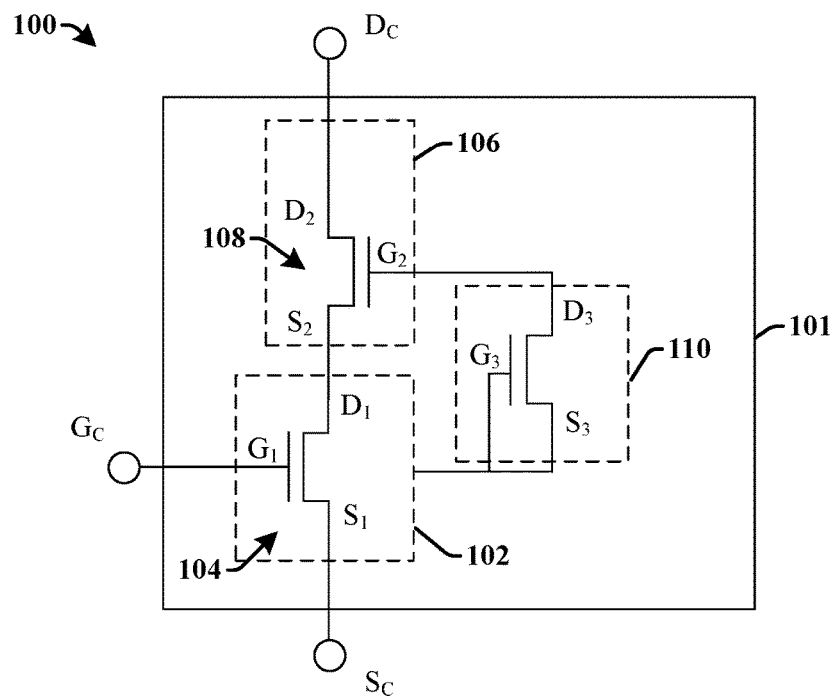
FIG. 1 illustrates a schematic diagram showing some embodiments of a high voltage device comprising a cascode structure having a plurality of high electron mobility transistor (HEMT) devices.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor transistors based on silicon have been a standard in the semiconductor industry for the past four decades. Silicon is a low cost semiconductor material that provides for good electrical properties. However, as the size of semiconductor components continues to scale (i.e., shrink), it has become increasing difficult to fabricate transistors on silicon substrates. As the scaling of silicon devices continues to become more difficult, semiconductor devices based on alternative materials are receiving increasing attention. Gallium nitride (GaN) devices are one popular alternative to silicon devices. GaN devices have a high carrier mobility and large band gap that is beneficial to high voltage and/or high power applications. The higher carrier mobility enables a GaN device to have a smaller physical size for a given on-resistance and/or breakdown voltage than a silicon device.

One common type of GaN device is a high electron mobility transistor (HEMT) devices. HEMT devices typically comprise a stacked structure having a layer of GaN and an overlying electron generating material (e.g., AlGaN). A heterojunction between the layer of GaN and the overlying electron generating material acts as a channel of the HEMT (instead of a doped region used in a MOSFET). To decrease device cost, the layer of GaN may be formed on a silicon substrate. GaN HEMT devices formed on a silicon substrate often suffer from lateral leakage between devices, as well as vertical leakage between a device and the silicon substrate. At high voltages (e.g., greater than approximately 500 V) vertical leakage dominates, so that a maximum breakdown voltage of a GaN device is proportional to a thickness of the layer of GaN.

For example, to form a device having a maximum breakdown voltage of 650 V and an acceptable level of vertical leakage, a thickness of a layer of GaN must be greater than approximately 5 μm (microns). To form a device having a maximum breakdown voltage of 1000 V and an acceptable level of vertical leakage, a layer of GaN may have to have a thickness that is approximately equal to 10 μm. However, due to lattice mismatch and deposition challenges it is difficult to grow thick layers of GaN (e.g., over 5 μm) over a silicon substrate. Because it is difficult to grow thick layers of GaN over a silicon substrate, it is challenging to form a GaN HEMT device having a high breakdown voltage (e.g., greater than approximately 1000 V).

The present disclosure, in some embodiments, relates to a high voltage device comprising a first HEMT device connected in series with a second HEMT device. A gate of the second HEMT device is connected to the first HEMT device by way of a diode-connected transistor. By coupling the first HEMT device in series with the second HEMT device, the two devices are able to collectively operate as equivalent to a single high voltage transistor device having a relatively large breakdown voltage (i.e., a breakdown voltage that is larger than breakdown voltages of either the first HEMT or the second HEMT device.) Therefore, two HEMT devices with relatively thin layers of GaN (e.g., 5 µm or less or less than 10 µm) can achieve a similar breakdown voltage as a high voltage device with a thicker layer of GaN (e.g., greater than 5 um).

FIG. 1 illustrates a schematic diagram of some embodiments of a high voltage device 100 having a plurality of high electron mobility transistor (HEMT) devices connected in series.

The high voltage device 100 comprises a cascode structure including a common source stage 102 and a common gate stage 106. The common source stage 102 comprises a first high electron mobility transistor (HEMT) device 104 having a first source $S_1$, a first drain $D_1$, and a first gate $G_1$. The common gate stage 106 comprises a second HEMT device 108 comprising a second source $S_2$ coupled to the first drain D1, a second drain $D_2$, and a second gate $G_2$. A diode-connected transistor 110 is coupled between the first HEMT device 104 and the second HEMT device 108 and is configured to protect the first HEMT device 104 from high voltages (e.g., within the second HEMT device 108) that could damage the first HEMT device 104. The diode-connected transistor 110 comprises a third gate $G_3$, a third source $S_3$ coupled to either the first gate $G_1$ or to the first source $S_1$ of the first HEMT device 104, and a third drain $D_3$ coupled to the second gate $G_2$ of the second HEMT device 108.

The first HEMT device 104, the second HEMT device 108, and the diode-connected transistor 110 are disposed within a package component 101. In some embodiments, the first HEMT device 104 may be an enhancement mode device (i.e., a normally off device). In various embodiments, the second HEMT device 108 may be an enhancement mode device (i.e., a normally off device) or a depletion mode device (i.e., a normally on device). In some embodiments, the diode-connected transistor 110 may be an enhancement mode HEMT device.

By coupling the first HEMT device 104 in series with the second HEMT device 108, the high voltage device 100 is able to operate in a manner that is equivalent to a single high voltage transistor device. For example, the first HEMT device 104 and the second HEMT device 108 are configured to collectively define a common source terminal $S_C$, a common drain terminal $D_C$, and a common gate terminal $G_C$ of the high voltage device 100. The high voltage device 100 has a breakdown voltage that is greater than breakdown voltages of either the first HEMT device 104 or the second HEMT device 108. For example, in some embodiments, the first HEMT device 104 and the second HEMT device 108 may respectively have breakdown voltages of approximately 650 V, while the high voltage device 100 may have a breakdown voltage of approximately 1200 V. By using the first HEMT device 104 and the second HEMT device 108 to operate as a single high voltage device, the high voltage device 100 is able to achieve a high breakdown voltage while using cost effective HEMT devices (e.g., while using HEMT devices with a GaN layer having a thickness of less than 10 µm).

Furthermore, the high voltage device 100 offers a capacitance that is superior to state of the art switching devices (e.g., single HEMT devices, silicon carbide MOSFETS, etc.), thereby providing the disclosed high voltage device 100 with good switching performance. For example, coupling the first HEMT device 104 and the second HEMT device 108 in series will result in the high voltage device 100 having an overall capacitance that is less than that of either the first HEMT device 104 and the second HEMT device 108 (e.g., thereby giving the disclosed high voltage device 100 a capacitance that is one to two orders of magnitude smaller than state of the art switching devices). This leads to improved figures of merit describing the switching characteristics of the device. For example, Qoss*Ron (wherein Qoss: MOSFET output capacitance charge and Ron: on resistance), a figure of merit describing operation of high speed switching of devices (e.g., describing the resonant source-drain transition time), may be more than twice as good as conventional silicon carbide MOSFET devices.

Figure 2:
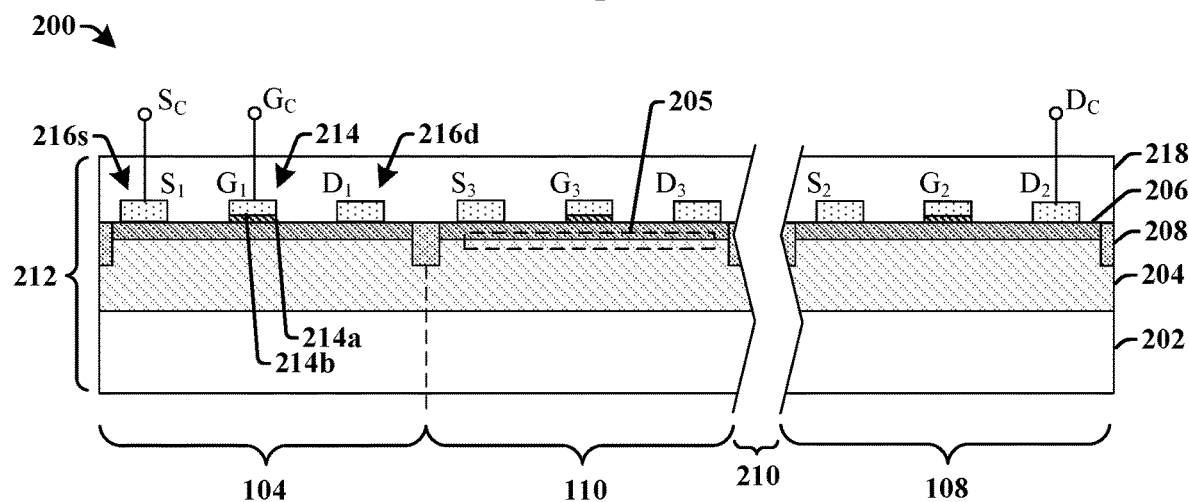
FIG. 2 illustrates a cross-sectional view of a high voltage device comprising a cascode structure having a plurality of HEMT devices.

FIG. 2 illustrates a cross-sectional view of a high voltage device 200 comprising a cascode having a plurality of HEMT devices. It will be appreciated that the cross-sectional views provided herein (e.g., in FIGS. 2, 3B, 4B, etc.) are schematic views and may not be representative of sizes and/or shapes of some components within the device.

The high voltage device 200 comprises a first HEMT device 104, a second HEMT device 108, and a diode-connected transistor 110 disposed within a semiconductor structure 212. The semiconductor structure 212 comprises a substrate 202, a channel structure 204 over the substrate 202, and an active structure 206 over the channel structure 204. The substrate 202 comprises a first semiconductor material, the channel structure 204 comprises a second semiconductor material, and the active structure 206 comprises a third semiconductor material. The second semiconductor material and the third semiconductor material have bandgaps that form a heterojunction between the channel structure 204 and the active structure 206. The heterojunction confines electrons to a quantum well that forms a two-dimensional electron gas (2DEG) 205 along an interface between the channel structure 204 and the active structure 206.

In some embodiments, the first semiconductor material may be silicon, the second semiconductor material may be gallium nitride, and the third semiconductor material may be aluminum gallium nitride. In other embodiments, the second semiconductor material and the third semiconductor material may comprise different III-V semiconductors (e.g., GaAs, GaSb, or the like). In some embodiments (not shown), a buffer layer may be arranged between the first semiconductor material and the second semiconductor material. The buffer layer is configured to reduce a lattice mismatch between the first semiconductor material and the second semiconductor material. In some embodiments, the buffer layer may comprise aluminum-nitride, for example.

A plurality of first isolation regions 208 may be arranged within the semiconductor structure 212 between two or more of the first HEMT device 104, the second HEMT device 108, and the diode-connected transistor 110. The plurality of first isolation regions 208 are configured to provide for electrical isolation between the first HEMT device 104, the second HEMT device 108, and/or the diode-connected transistor 110. In some embodiments, the plurality of first isolation regions 208 are disposed within the channel structure 204 and the active structure 206. In some embodiments, the plurality of first isolation regions 208 may comprise doped regions (e.g., having fluorine dopants, oxygen dopants, or the like). In other embodiments, the plurality of first isolation regions 208 may comprise a dielectric material (e.g., a shallow trench isolation structure).

A second isolation region 210 is also disposed between the first HEMT device 104 and the second HEMT device 108. The second isolation region 210 is configured to provide electrical isolation between the first HEMT device 104 and the second HEMT device 108. In some embodiments, the second isolation region 210 may comprise a doped isolation region. In other embodiments, the second isolation region 210 may be a region that is devoid of semiconductor material. For example, in some such embodiments, the semiconductor structure 212 may comprise a first region (e.g., a first die) and a second region (e.g., a second die) having outermost sidewalls that are laterally separated by a non-zero distance. In some embodiments, the first HEMT device 104 and the diode-connected transistor 110 may be disposed within the first region and the second HEMT device 108 may be disposed within the second region.

The first HEMT device 104, the second HEMT device 108, and the diode-connected transistor 110 respectively comprise a gate structure 214 disposed over the active structure 206 between a source contact 216s and a drain contact 216d. The gate structure 214, the source contact 216s, and the drain contact 216d define: a first gate $G_1$, a first source $S_1$, and a first drain $D_1$ of the first HEMT device 104; a second gate $G_2$, a second source $S_2$, and a second drain $D_2$ of the second HEMT device 108; and a third gate $G_3$, a third source $S_3$, and a third drain $D_3$ of the diode-connected transistor 110. In some embodiments, the distance from a gate to a drain for the first HEMT device 104, the second HEMT device 108, and/or the diode connected transistor 110 may be in a range of between approximately 15 microns (μm) and approximately 20 μm. For example, the distance may from a gate (e.g., the first gate $G_1$) to a drain (e.g., the first drain $D_1$) may be equal to approximately 18 μm.

The gate structure 214 comprises a lower gate portion 214a and a gate electrode 214b disposed over the lower gate portion 214a. In some embodiments, the lower gate portion 214a may comprise a dielectric material (e.g., an oxide, a nitride, or the like). In other embodiments, the lower gate portion 214a may comprise a semiconductor material (e.g., p-doped gallium nitride). In some embodiments, the gate electrode 214b may comprise a metal (e.g., aluminum, titanium, copper, tungsten, tantalum, or the like) or doped polysilicon. In some embodiments, the lower gate portion 214a of the first HEMT device 104, the second HEMT device 108, and/or the diode-connected transistor 110 may comprise different materials. For example, in some embodiments, the lower gate portion 214a of the first HEMT device 104 and the diode-connected transistor 110 may comprise a dielectric material, while the lower gate portion 214a of the second HEMT device 108 may comprise p-doped GaN. In other embodiments, the lower gate portion 214a of the first HEMT device 104, the second HEMT device 108, and the diode-connected transistor 110 may comprise a same material (e.g., a dielectric material).

To provide the high voltage device 200 with a large breakdown voltage (e.g., a breakdown voltage of greater than approximately 1200 V), the effective width of the first gate $G_1$, the second gate $G_2$, and the third gate $G_3$ may have a relatively large size. In some embodiments, the effective width of the first gate $G_1$, the second gate $G_2$, and the third gate $G_3$ may be in a range of between approximately 200 millimeters (mm) and approximately 300 mm. In some such embodiments, the first gate $G_1$ and/or the second gate $G_2$ may respectively have effective widths in a range of between approximately 100 mm and approximately 150 mm, while the effective width of the third gate $G_3$ may be in a range of between approximately 5 mm and 15 mm. For example, the effective width of the first gate $G_1$ and/or the second gate $G_2$ may be equal to approximately 120 mm, while the effective width of the g third gate $G_3$ may be approximately equal to 11.2 mm. In some embodiments, the first gate $G_1$, the second gate $G_2$, and the third gate $G_3$ may have effective widths extend along multiple different directions (e.g., along a first direction and a second direction perpendicular to the first direction). By having the effective widths of the first gate $G_1$, the second gate $G_2$, and the third gate $G_3$ extend along multiple different directions, the gates may be disposed in a layout that is contained within an area that is smaller than the effective widths (e.g., within a 10 mm² area).

A dielectric structure 218 is disposed over the active structure 206. The dielectric structure 218 surrounds the gate structure 214, the source contact 216s, and the drain contact 216d. The gate structure 214, the source contact 216s, and the drain contact 216d are electrically connected (e.g., as shown in FIG. 1) by one or more conductive layers (not shown). In some embodiments, the one or more conductive layers may comprise interconnect layers disposed within the dielectric structure 218. In some additional embodiments, the one or more conductive layers may comprise redistribution layers, conductive layers within an interposer substrate, conductive traces on a printed circuit board, or the like.

Figure 3A:
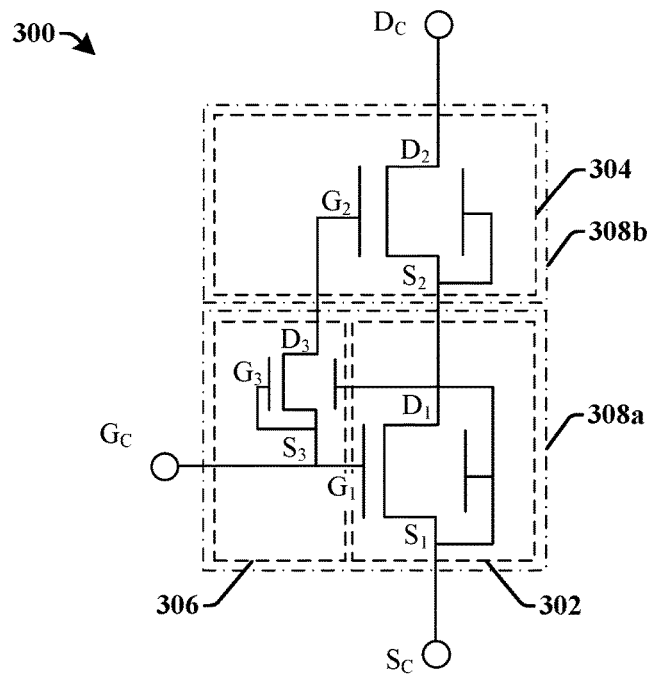
FIGS. 3A-3B, 4A-4B, and 5A-5B illustrate some additional embodiments of high voltage devices comprising a cascode structure having a plurality of HEMT devices.
Figure 3B:
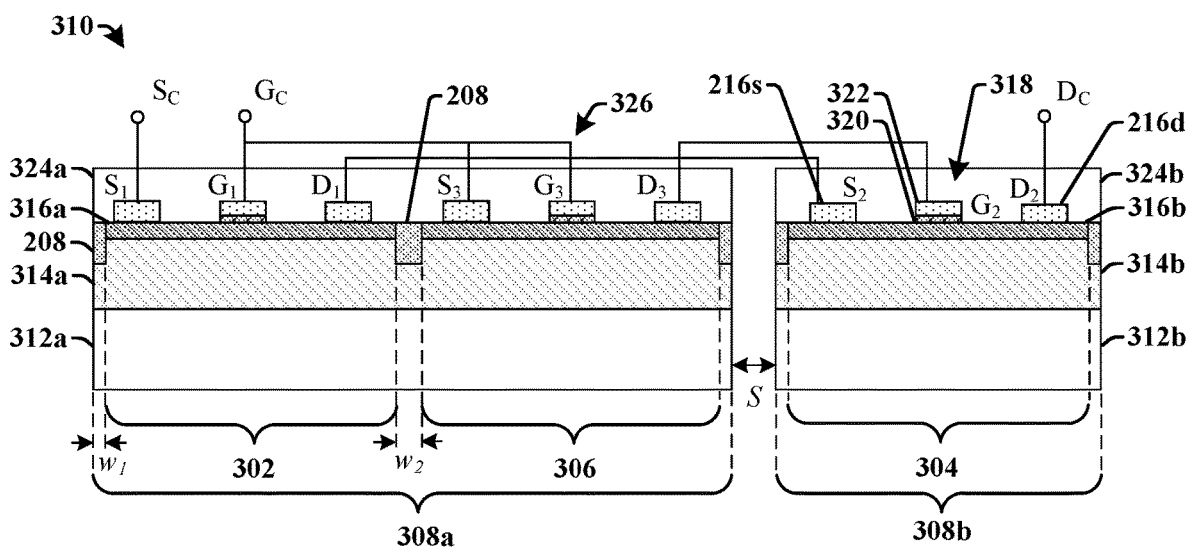

FIGS. 3A-3B illustrate some additional embodiments of a high voltage device comprising a cascode having a plurality of high electron mobility transistor devices.

As shown in a schematic diagram 300 of FIG. 3A, the high voltage device comprises a first HEMT device 302, a second HEMT device 304, and a diode-connected HEMT device 306. The first HEMT device 302 and the diode-connected HEMT device 306 are disposed within a first die 308a, while the second HEMT device 304 is disposed within a second die 308b. The first HEMT device 302 comprises a first source $S_1$, a first drain $D_1$, and a first gate $G_1$. The second HEMT device 304 comprises a second source $S_2$ coupled to the first drain $D_1$, a second drain $D_2$, and a second gate $G_2$. The diode-connected HEMT device 306 comprises a third source $S_3$ coupled to the first gate $G_1$, a third drain $D_3$ coupled to the second gate $G_2$, and a third gate $G_3$ coupled to the third source $S_3$. The first HEMT device 302, the second HEMT device 304, and the diode-connected HEMT device 306 are enhancement mode devices (i.e., normally off devices), which are in an off state when a zero bias is applied to their gates.

The first HEMT device 302 and the second HEMT device 304 provide the high voltage device with a common source $S_C$, a common drain $D_C$, and a common gate $G_C$. During operation, the common source $S_C$ may be held at $V_{SS}$ (e.g., ground) and the common drain $D_C$ may be held at $V_{DD}$ (e.g., 1000 V). A bias voltage that is applied to a common gate terminal $G_C$ will turn on both the first HEMT device 302 and the second HEMT device 304. By coupling the first gate $G_1$ to the second gate $G_2$ using the diode-connected HEMT device 306, the first gate $G_1$ will not be inadvertently affected by a gate-drain voltage ($V_{GD}$) of the second HEMT device 304 and the first gate $G_1$ is also protected from a potentially high gate-source voltage ($V_{GS}$) of the second HEMT device 304.

As shown in cross-sectional view 310 of FIG. 3B, the first HEMT device 302 and the diode-connected HEMT device 306 are arranged within the first die 308a, and the second HEMT device 304 is arranged within the second die 308b that is different than the first die 308a. The first die 308a and the second die 308b have outermost sidewalls that are separated by a non-zero distance S. The non-zero distance S separates the first die 308a from the second die 308b to prevent leakage between the first HEMT device 302 and the second HEMT device 304.

In some embodiments, the first die 308a includes a first substrate 312a comprising a first semiconductor material, a first channel layer 314a positioned over the first substrate 312a and comprising a second semiconductor material, and a first active layer 316a positioned over the first channel layer 314a and comprising a third semiconductor material different the second semiconductor material. In some embodiments, the second die 308b includes a second substrate 312b comprising the first semiconductor material, a second channel layer 314b positioned over the second substrate 312b and comprising the second semiconductor material, and a second active layer 316b positioned over the second channel layer 314b and comprising the third semiconductor material. In some embodiments, the first semiconductor material may comprise or be silicon, the second semiconductor material may comprise or be gallium nitride, and the third semiconductor material may comprise or be aluminum gallium nitride.

In some embodiments, the first channel layer 314a and the second channel layer 314b may comprise GaN having thicknesses that are less than or equal to approximately 5 microns, since GaN is able to be reliably formed onto silicon at such thicknesses at a relatively low cost. In some other embodiments, the first channel layer 314a and the second channel layer 314b may comprise GaN having thicknesses that are less than or less than or equal to approximately 10 microns, since GaN may be able to be reliably formed onto silicon at such thicknesses. In yet other embodiments, the first channel layer 314a and the second channel layer 314b may comprise GaN having thicknesses that are greater than 5 microns. For example, the first channel layer 314a and the second channel layer 314b may comprise GaN having thicknesses that are between approximately 5 microns and approximately 10 microns.

A plurality of first isolation regions 208 are arranged within the first die 308a between the first HEMT device 302 and the diode-connected HEMT device 306. The plurality of first isolation regions 208 may comprise doped regions that break (i.e., interrupt) a 2DEG disposed between the first channel layer 314a and the first active layer 316a. In some embodiments, the plurality of first isolation regions 208 may comprise oxygen dopants, fluorine dopants, or the like. The plurality of first isolation regions 208 may continuously extend around the first HEMT device 302, the second HEMT device 304, and the diode-connected HEMT device 306. In some embodiments, the plurality of first isolation regions 208 have a first width $w_1$ along outer edges of the first die 308a and a second width $w_2$ directly between the first HEMT device 302 and the diode-connected HEMT device 306. In some embodiments, the second width 1422 is larger than the first width $w_1$ due to a dicing process used to singulate the first die 308a.

The first HEMT device 302, the diode-connected HEMT device 306, and the second HEMT device 304 respectively comprise a source contact 216s, a drain contact 216d, and a gate structure 318 disposed within a first dielectric structure 324a and a second dielectric structure 324b over the first active layer 316a and the second active layer 316b. One or more conductive layers 326 are coupled to the source contact 216s, the drain contact 216d, and the gate structure 318 of the first HEMT device 302, the diode-connected HEMT device 306, and the second HEMT device 304. The one or more conductive layers 326 are configured to electrically couple the first HEMT device 302, the diode-connected HEMT device 306, and the second HEMT device 304 as shown in FIG. 3A. In some embodiments, the one or more conductive layers 326 may comprise interconnect layers (e.g., interconnect wires and/or vias), bond wires, or the like.

The source contact 216s and the drain contact 216d comprise a conductive material, such as a metal, such as aluminum, tungsten, copper, gold, titanium, tantalum, or the like. In some embodiments, since the first HEMT device 302, the second HEMT device 304, and the diode-connected HEMT device 306 are enhancement mode devices, the gate structure 318 may comprise a doped layer of semiconductor material 320 and a gate electrode 322 disposed over the doped layer of semiconductor material 320. In some embodiments, the doped layer of semiconductor material 320 may comprise GaN layer having p-type dopants. In some embodiments, the gate electrode 322 may comprise a metal, such as aluminum, tungsten, copper, gold, titanium, tantalum, or the like.

Figure 4A:
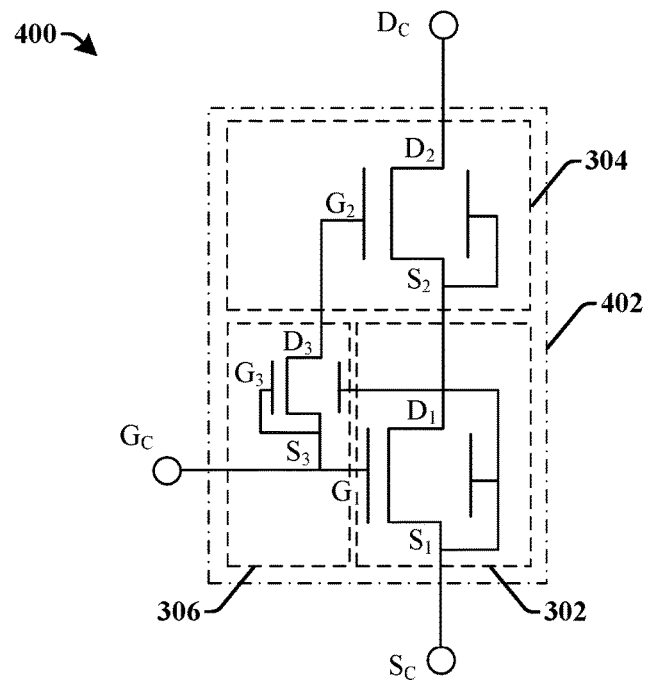
Figure 4B:
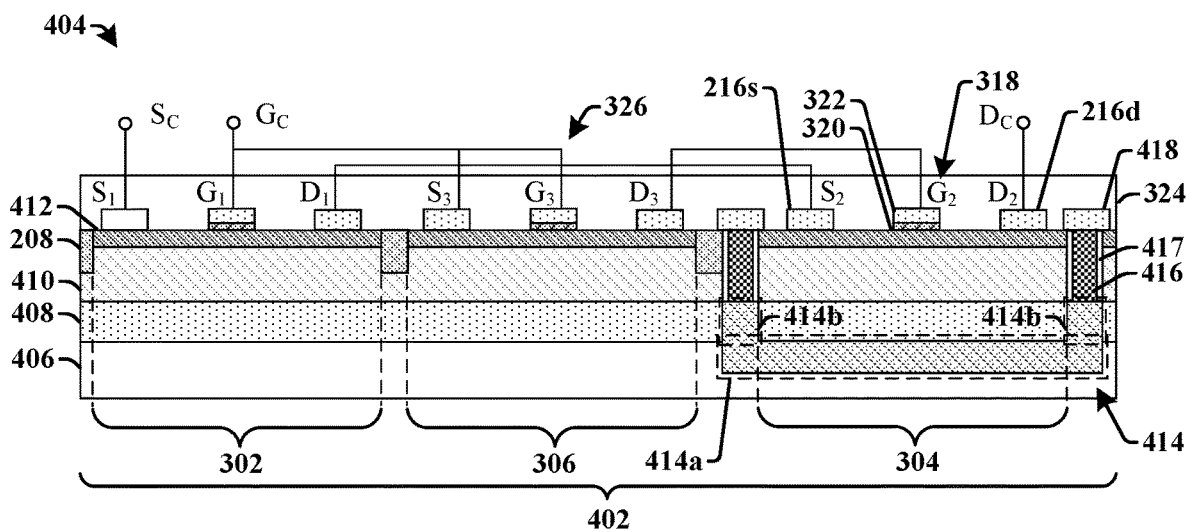

FIGS. 4A-4B illustrate some additional embodiments of a high voltage device comprising a cascode having a plurality of HEMT devices.

As shown in a schematic diagram 400 of FIG. 4A, the high voltage device comprises a first HEMT device 302, a second HEMT device 304, and a diode-connected HEMT device 306. The first HEMT device 302, the second HEMT device 304, and the diode-connected HEMT device 306 are disposed within a die 402. The first HEMT device 302, the second HEMT device 304, and the diode-connected HEMT device 306 are enhancement mode devices (i.e., a normally off devices), which are in an off state when a zero bias is applied to their gates.

As shown in cross-sectional view 404 of FIG. 4B, the first HEMT device 302, the second HEMT device 304, and the diode-connected HEMT device 306 are arranged within the die 402, which includes a substrate 406 having a first doping type, an epitaxial buffer layer 408 over the substrate 406, a channel layer 410 over the epitaxial buffer layer 408, and an active layer 412 over the channel layer 410. In some embodiments, the substrate 406 and the epitaxial buffer layer 408 may comprise or be silicon having the first doping type (e.g., p-type), the channel layer 410 may comprise or be gallium nitride, and the active layer 412 may comprise or be aluminum gallium nitride. In some embodiments, the channel layer 410 may be gallium nitride having a thickness that is less than or equal to approximately 10 microns. In some embodiments, the channel layer 410 may be gallium nitride having a thickness that is less than or equal to approximately 5 microns.

An isolation structure 414 is disposed within the die 402. The isolation structure 414 has a second doping type (e.g., n-type) that is different than the first doping type. The isolation structure 414 comprises a horizontally extending isolation region 414a disposed laterally between sidewalls of one or more vertically extending isolation regions 414b. In some embodiments, the epitaxial buffer layer 408 is arranged between the isolation structure 414 and the channel layer 410. During formation of the horizontally extending isolation region 414a lattice damage may occur to the substrate 406. The epitaxial buffer layer 408 provides for a consistent lattice for the channel layer 410 to be grown on, to avoid propagation of lattice damage within the substrate 406.

Conductive contacts 416 extend through the channel layer 410 and the active layer 412 to contact the one or more vertically extending isolation regions 414b. The conductive contacts 416 are further coupled to conductive contacts 418 arranged within a dielectric structure 324 over the active layer 412. In some embodiments, the conductive contacts 416 physically contact the isolation structure 414 along a horizontal plane extending along a top surface of the epitaxial buffer layer 408.

The conductive contacts 416 are configured to apply a bias voltage to the isolation structure 414 to form a junction that electrically isolates the substrate 406 from the channel layer 410 of the second HEMT device 304. By electrically isolating the substrate 406 from the channel layer 410 of the second HEMT device 304, leakage between the devices through the substrate 406 is mitigated. In some embodiments, an insulating layer 417 comprising one or more dielectric materials may be disposed along sidewalls of the conductive contacts 416. In some such embodiments, the insulating layer 417 may comprise a first dielectric material contacting the epitaxial buffer layer 408, a second dielectric material contacting the channel layer 410, and a third dielectric material contacting the active layer 412. In other embodiments, the conductive contacts 416 may directly contact the channel layer 410.

In some embodiments, a plurality of first isolation regions 208 may continuously extend around the first HEMT device 302 and the diode-connected HEMT device 306. In some embodiments, the conductive contacts 416 and underlying isolation structure 414 may continuously extend around the second HEMT device 304. In other embodiments, the isolation structure 414 may continuously extend around the second HEMT device 304 while the conductive contacts 416 may comprise discrete segments disposed over part of the isolation structure 414.

Figure 5A:
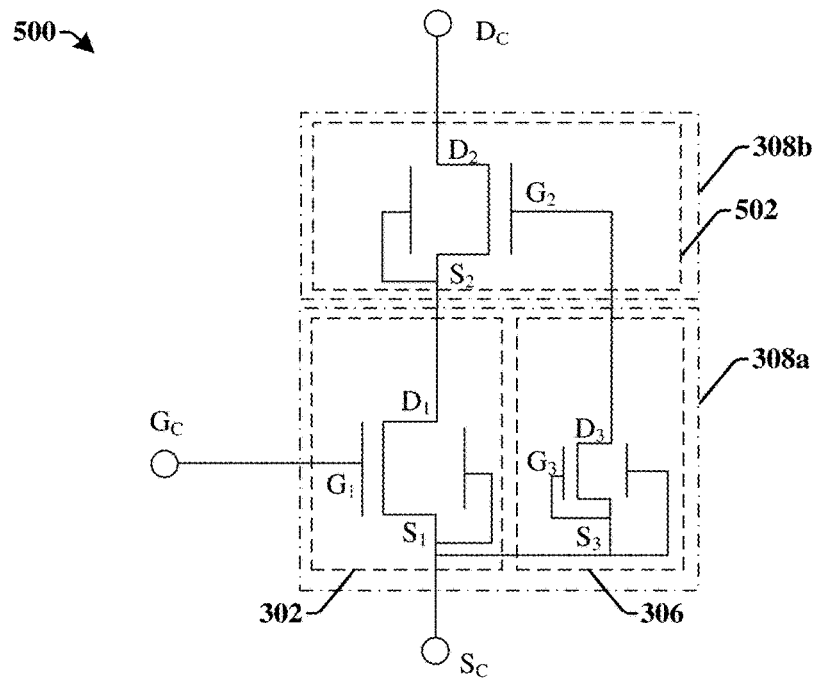
Figure 5B:
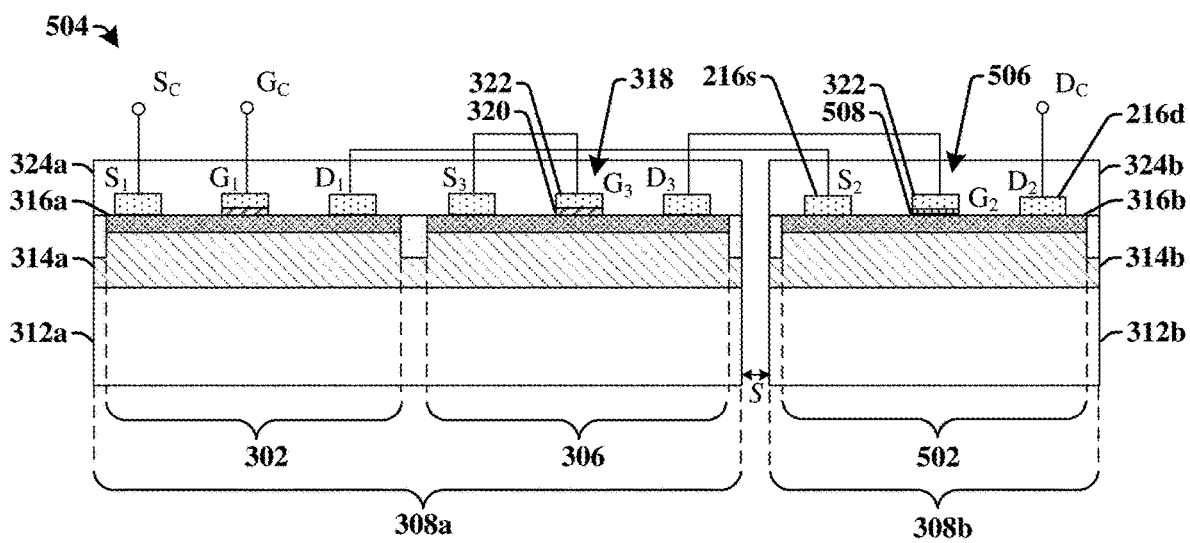

FIGS. 5A-5B illustrate some additional embodiments of a high voltage device comprising a cascode having a plurality of HEMT devices.

As shown in a schematic diagram 500 of FIG. 5A, the high voltage device comprises a first HEMT device 302, a second HEMT device 502, and a diode-connected HEMT device 306. The first HEMT device 302 and the diode-connected HEMT device 306 are disposed within a first die 308a, while the second HEMT device 502 is disposed within a second die 308b. The first HEMT device 302 and the diode-connected HEMT device 306 are enhancement mode devices (i.e., a normally off devices), which are in an off state when a zero bias is applied to their gates. The second HEMT device 502 is a depletion mode device (i.e., a normally on devices), which is in an on state when a zero bias is applied to its gate.

The first HEMT device 302 comprises a first source $S_1$, a first drain $D_1$, and a first gate $G_1$. The second HEMT device 502 comprises a second source $S_2$ coupled to the first drain $D_1$, a second drain $D_2$, and a second gate $G_2$. The diode-connected HEMT device 306 comprises a third source region $S_3$ coupled to the first source $S_1$ and a third drain $D_3$ coupled to the second gate $G_2$. By coupling the first source $S_1$ to the second gate $G_2$ using the diode-connected HEMT device 306, the first HEMT device 302 will not be inadvertently affected by a gate-drain ($V_{GD}$) voltage of the second HEMT device 304.

As shown in cross-sectional view 504 of FIG. 5B, the first HEMT device 302 and the diode-connected HEMT device 306 are arranged within the first die 308a, and the second HEMT device 502 is arranged within the second die 308b. The first die 308a and the second die 308b have outermost sidewalls that are separated by a non-zero distance S.

The first HEMT device 302, the diode-connected HEMT device 306, and the second HEMT device 502 respectively comprise a source contact 216s and a drain contact 216d. Since the first HEMT device 302 and the diode-connected HEMT device 306 are enhancement mode devices, the first HEMT device 302 and the diode-connected HEMT device 306 comprise a gate structure 318 comprising a doped layer of semiconductor material 320 and a gate electrode 322 over the doped layer of semiconductor material 320. Since the second HEMT device 502 is a depletion mode device, the second HEMT device 502 comprises a gate structure 506 having a dielectric layer 508 and a gate electrode 322 over the dielectric layer 508.

Figure 6A:
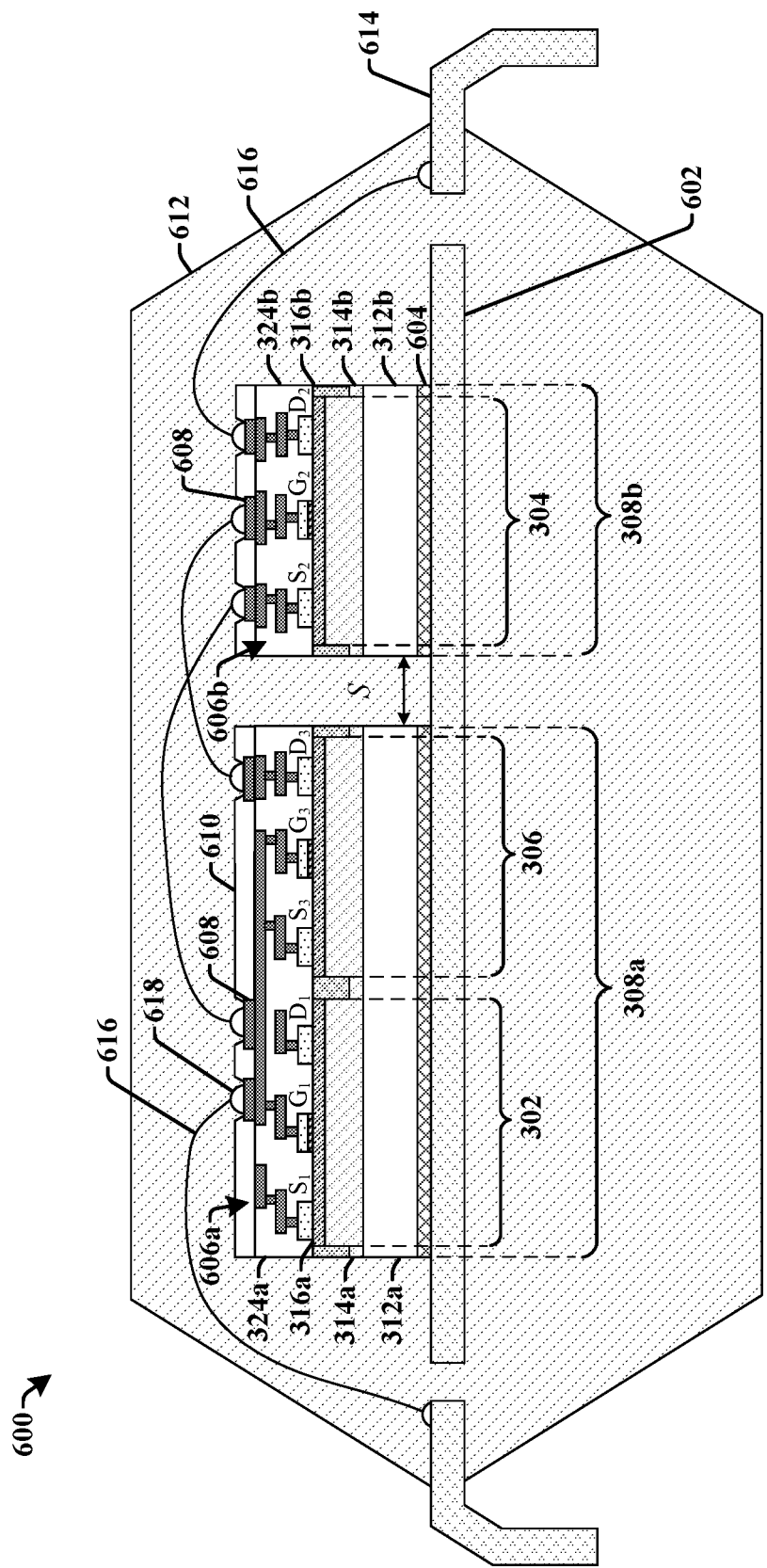
FIGS. 6A-6B, 7, and 8 illustrate cross-sectional views of some embodiments of packaged high voltage device comprising a cascode structure having a plurality of HEMT devices.
Figure 6B:
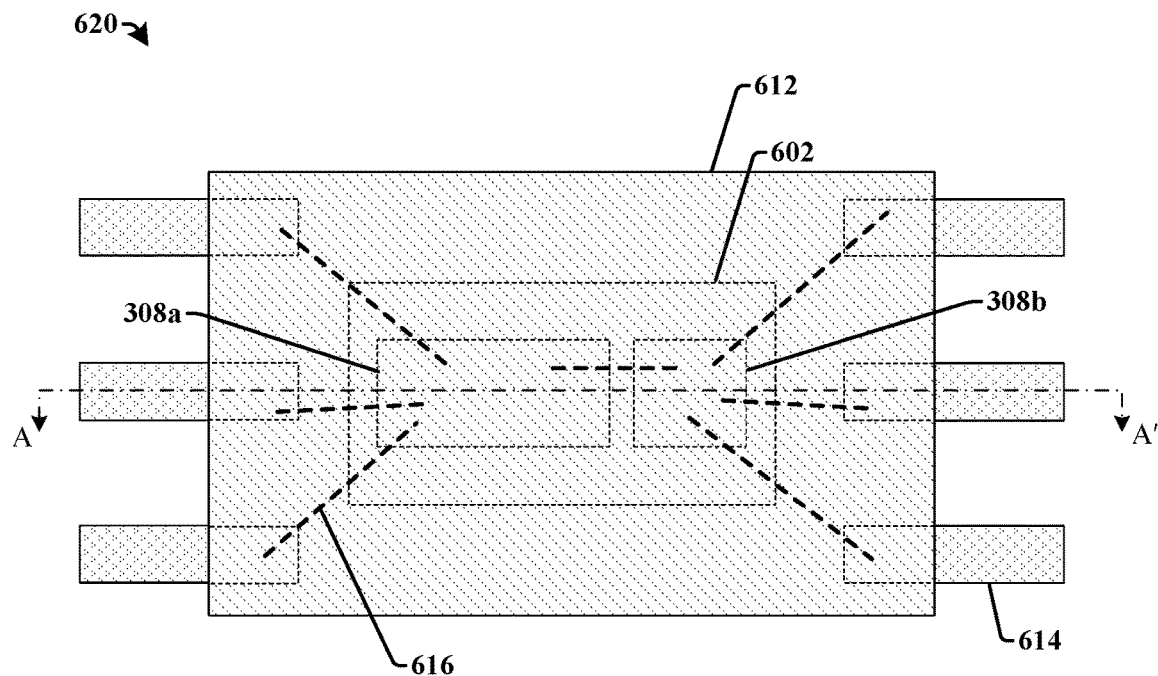

FIGS. 6A-6B illustrate of some embodiments of a packaged high voltage device comprising a cascode structure having a plurality of HEMT devices. FIG. 6A illustrates a cross-sectional view 600 of the packaged high voltage device. FIG. 6B illustrates a top-view 620 of the packaged high voltage device. The cross-sectional view 600 is taken along line A-A' of the top-view 620.

The packaged high voltage device includes a die pad 602 over which a first die 308a and a second die 308b are bonded. In some embodiments, the first die 308a and the second die 308b are bonded to the die pad 602 by way of an adhesion layer 604. In various embodiments, the adhesion layer 604 may comprise a glue, an epoxy, or the like. The first die 308a and the second die 308b are typically spaced apart by a non-zero distance S. In some embodiments, the non-zero distance S may be in a range of between approximately 1 micrometer and approximately 1 mm to ensure electrical isolation between the first die 308a and the second die 308b.

The die pad 602 is surrounded by a molding compound 612 that continuously extends over the first die 308a and the second die 308b. A plurality of lead frames 614 extend from within the molding compound 612 to outside of the molding compound 612. In some embodiments, the molding compound 612 may include epoxy, silicon, silica filler, and/or other types of polymers. One or more bond wires 616 are configured to couple the first die 308a and the second die 308b. The one or more bond wires 616 further couple the first die 308a and the second die 308b to the plurality of lead frames 614. In some embodiments, the one or more bond wires 616 are coupled to the bond pads 608 and to the lead frames 614 by way of solder balls 618.

As shown in cross-sectional view 600, the first die 308a comprises a first dielectric structure 324a surrounding a first plurality of conductive interconnect layers 606a. The first plurality of conductive interconnect layers 606a electrically couple the first HEMT device 302 and the diode-connected HEMT device 306 to bond pads 608 over the first dielectric structure 324a. In some embodiments, a passivation layer 610 may be over the bond pads 608. The second die 308b comprises a second dielectric structure 324b surrounding a second plurality of conductive interconnect layers 606b. The second plurality of conductive interconnect layers 606b electrically couple the second HEMT device to bond pads 608 over the second dielectric structure 324b. In some embodiments, the first dielectric structure 324a and/or the second dielectric structure 324b comprise stacked ILD layers respectively comprising silicon dioxide, doped silicon dioxide (e.g., carbon doped silicon dioxide), silicon oxynitride, borosilicate glass (BSG), phosphoric silicate glass (PSG), borophosphosilicate glass (BPSG), fluorinated silicate glass (FSG), or the like.

In some embodiments (not shown), the first plurality of conductive interconnect layers 606a are configured to electrically couple a first gate $G_1$ of the first HEMT device 302 to a third source $S_3$ and a third gate $G_3$ of the diode-connected HEMT device 306. The one or more bond wires 616 are configured to electrically couple a first drain $D_1$ of the first HEMT device 302 to a second source $S_2$ of the second HEMT device 304 and to further couple the second gate $G_2$ of the second HEMT device 304 to a third drain $D_3$ of the diode-connected HEMT device 306.

In other embodiments (not shown), the first plurality of conductive interconnect layers 606a are configured to electrically couple a first source $S_1$ of the first HEMT device 302 to a third source $S_3$ and a third gate $G_3$ of the diode-connected HEMT device 306. The one or more bond wires 616 are configured to electrically couple a first drain $D_1$ of the first HEMT device 302 to a second source $S_2$ of the second HEMT device 304 and to further couple the second gate $G_2$ of the second HEMT device 304 to a third drain $D_3$ of the diode-connected HEMT device 306.

Figure 7:
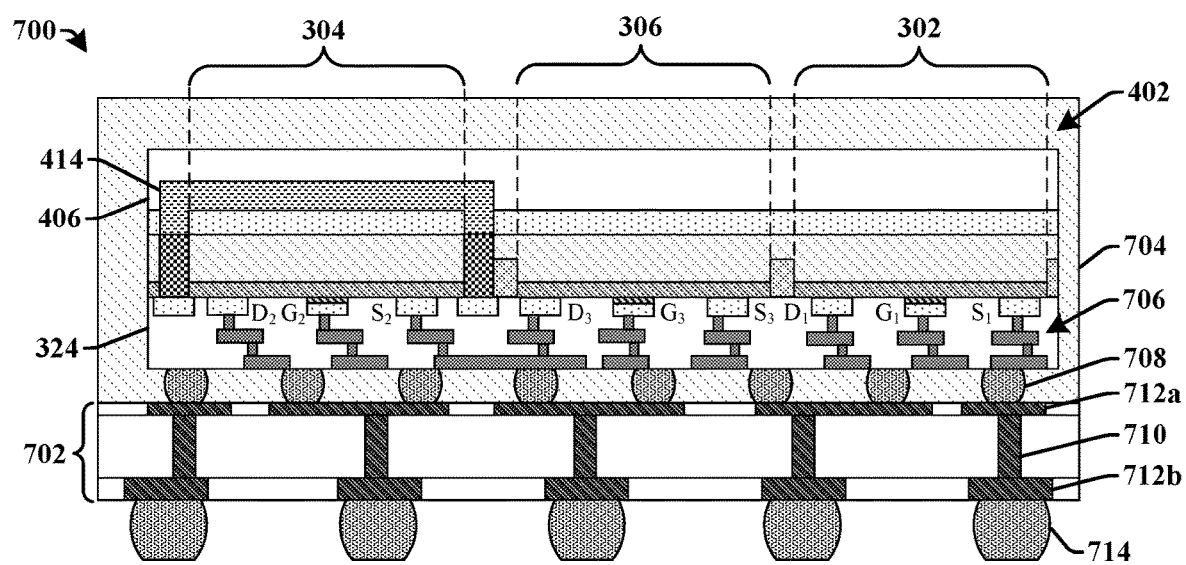

FIG. 7 illustrates a cross-sectional view of some additional embodiments of a packaged high voltage device 700 comprising a cascode structure having a plurality of HEMT devices.

The packaged high voltage device 700 comprises a die 402 disposed over a carrier substrate 702 (e.g., an interposer substrate). The die 402 comprises a first HEMT device 302, a second HEMT device 304, and a diode-connected HEMT device 306. A molding compound 704 is also disposed over the carrier substrate 702 and surrounds the die 402.

The die 402 comprises a dielectric structure 324 surrounding a plurality of conductive interconnect layers 706. In some embodiments (not shown), the plurality of conductive interconnect layers 706 are configured to electrically couple a first gate $G_1$ of the first HEMT device 302 to a third source $S_3$ and a third gate $G_3$ of the diode-connected HEMT device 306, a first drain $D_1$ of the first HEMT device 302 to a second source $S_2$ of the second HEMT device 304, and to further couple the second gate $G_2$ of the second HEMT device 304 to the third drain $D_3$ of the diode-connected HEMT device 306.

The die 402 is electrically coupled to the carrier substrate 702 by way of a plurality of micro-bumps 708. A plurality of through substrate vias (TSVs) 710 extend through the carrier substrate 702 and electrically couple the plurality of micro-bumps 708 to a plurality of solder bumps 714. In some embodiments, one or more redistribution layers, 712a and/or 712b, may be arranged along top and/or bottoms of the carrier substrate 702 to provide for lateral routing between the TSVs 710 and the plurality of micro-bumps 708 and/or the plurality of solder bumps 714.

Figure 8:
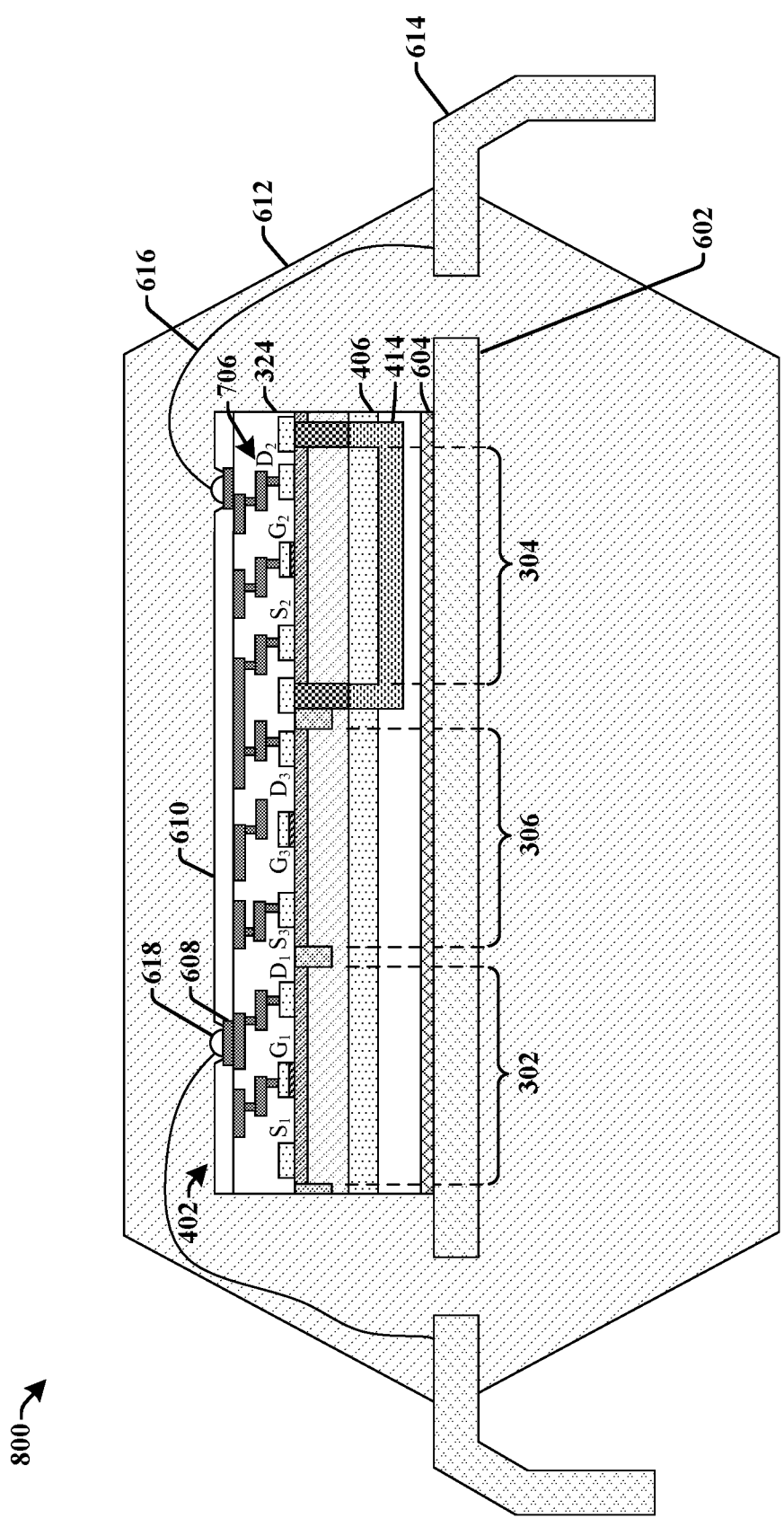

FIG. 8 illustrates a cross-sectional view of some additional embodiments of a packaged high voltage device 800 comprising a cascode structure having a plurality of HEMT devices.

The packaged high voltage device 800 includes a die pad 602 over which a die 402 is bonded. In some embodiments, the die 402 is bonded to the die pad 602 by way of an adhesion layer 604. The die pad 602 is surrounded by a molding compound 612 that extends over the die 402. A plurality of lead frames 614 extend from within the molding compound 612 to outside of the molding compound 612. One or more bond wires 616 are configured to couple the die 402 to the plurality of lead frames 614. In some embodiments, the one or more bond wires 616 are coupled to the bond pads 608 and to the lead frames 614 by way of solder balls 618.

The die 402 comprises a dielectric structure 324 surrounding a plurality of conductive interconnect layers 706. In some embodiments, the plurality of conductive interconnect layers 706 are configured to electrically couple a first gate $G_1$ of the first HEMT device 302 to a third source $S_3$ and a third gate $G_3$ of the diode-connected HEMT device 306, a first drain $D_1$ of the first HEMT device 302 to a second source $S_2$ of the second HEMT device 304, and to further couple the second gate $G_2$ of the second HEMT device 304 to the third drain $D_3$ of the diode-connected HEMT device 306

FIGS. 9-15 illustrate cross-sectional views 900-1500 of some embodiments of method of forming a high voltage device comprising a cascode structure having a plurality of HEMT devices. Although the cross-sectional views 900-1500 shown in FIGS. 9-15 are described with reference to a method of forming a cascode structure having a plurality of HEMT devices, it will be appreciated that the structures shown in FIGS. 9-15 are not limited to the method of formation but rather may stand alone separate of the method.

Figure 9:
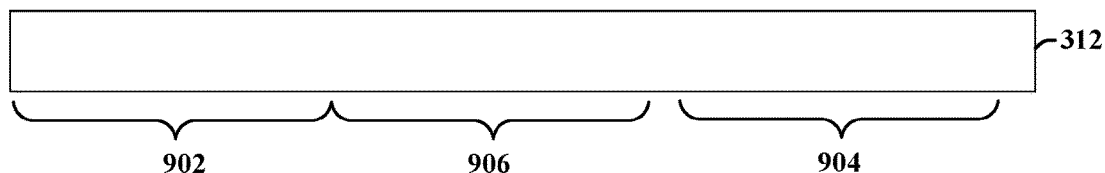
FIGS. 9-11, 12A-12B, and 13-15 illustrate cross-sectional views of some embodiments of method of forming a high voltage device comprising a cascode structure having a plurality of HEMT devices.

As shown in cross-sectional view 900 of FIG. 9, a substrate 312 is provided. The substrate 312 comprises a semiconductor material having a first doping type (e.g., a p-type dopant). In various embodiments, the substrate 312 may be any type of semiconductor body (e.g., silicon, SiGe, SOI, etc.), as well as any other type of semiconductor, epitaxial, dielectric, or metal layers, associated therewith. The substrate 312 comprises a first HEMT device region 902, a second HEMT device region 904, and a diode-connected HEMT device region 906.

Figure 10:
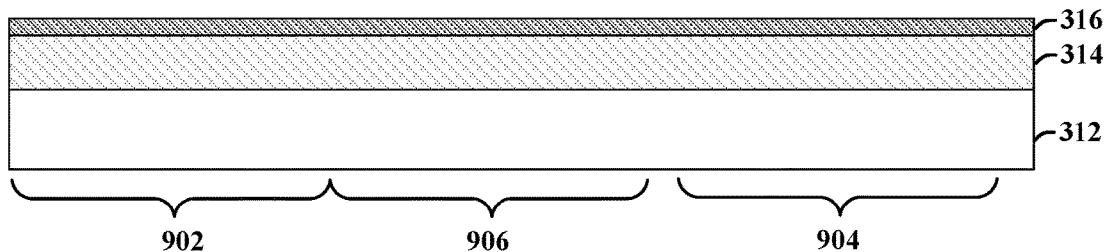

As shown in cross-sectional view 1000 of FIG. 10, a channel layer 314 is formed over the substrate 312 and an active layer 316 is formed over the channel layer 314. The channel layer 314 comprises a first material that is different than a second material of the active layer 316. For example, in some embodiments, the channel layer 314 may comprise gallium nitride (GaN) and the active layer 316 may comprise aluminum gallium nitride (AlGaN). In various embodiments, the channel layer 314 and/or the active layer 316 may be formed onto the substrate 312 by way of deposition processes (e.g., chemical vapor deposition (CVD), plasma enhanced chemical vapor deposition (PE-CVD), atomic layer deposition (ALD), physical vapor deposition (PVD), etc.). In some embodiments, the channel layer 314 may be formed to a thickness that is less than or equal to approximately 5 microns, to provide for a high quality channel layer at a relatively low cost.

Figure 11:
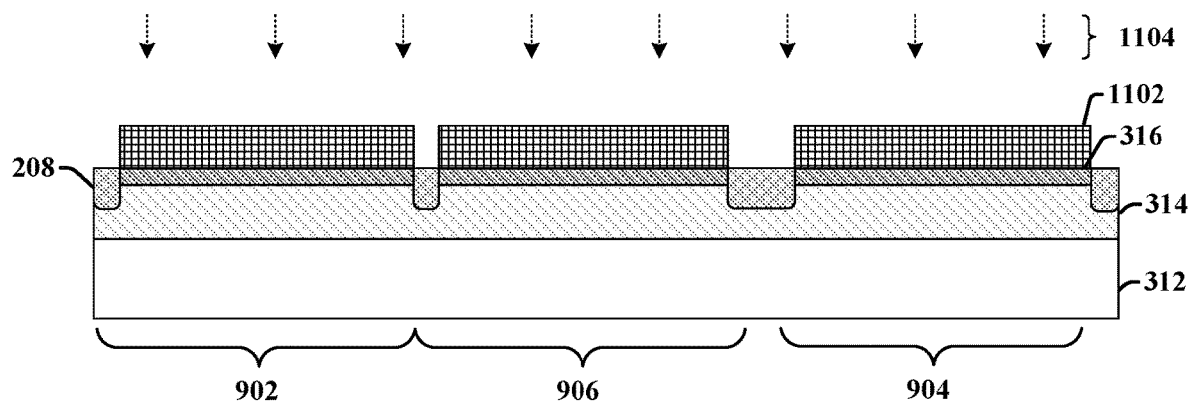

As shown in cross-sectional view 1100 of FIG. 11, a plurality of first isolation regions 208 are formed within the active layer 316. The plurality of first isolation regions 208 may comprise doped regions that vertically extend from a top of the active layer 316 to within the channel layer 314. The plurality of first isolation regions 208 are laterally positioned between the first HEMT device region 902, the second HEMT device region 904, and the diode-connected HEMT device region 906.

In some embodiments, the plurality of first isolation regions 208 are formed by forming a first patterned masking layer 1102 over the active layer 316 and subsequently implanting one or more dopant species 1104 into the active layer 316 according to the first patterned masking layer 1102. In some embodiments, the dopant species 1104 may be implanted with an energy that is sufficient to drive the dopant species 1104 into the channel layer 314. In some embodiments, a drive-in anneal may be performed to diffuse the dopant species after the implantation. In some embodiments, the dopant species 1104 may comprise oxygen dopants, fluorine dopants, or the like. In some embodiments, the first patterned masking layer 1102 may comprise photoresist, for example.

Figure 12A:
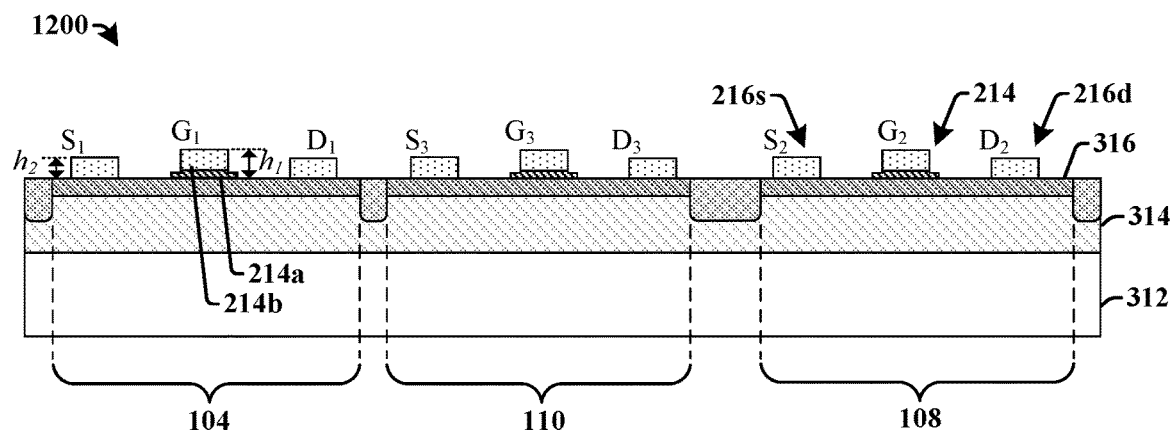
Figure 12B:
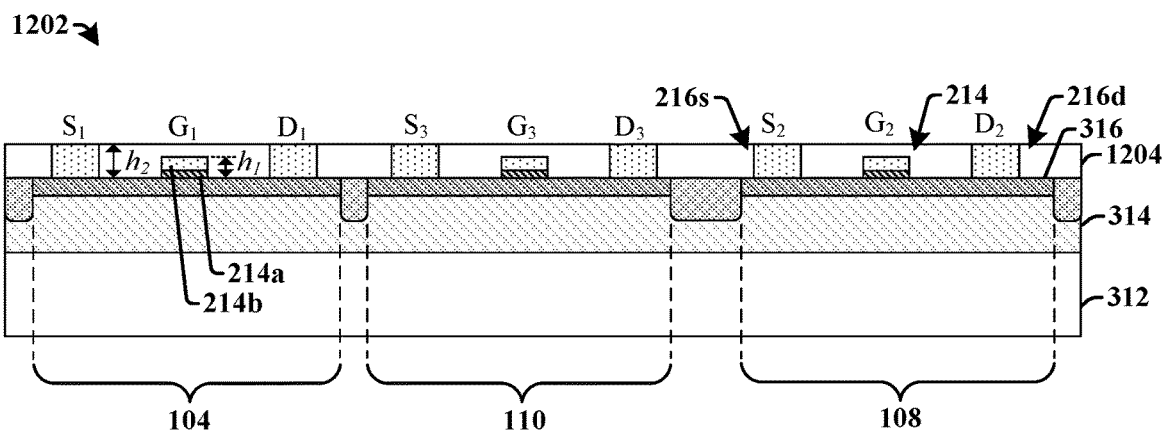

Cross-sectional view 1200 of FIG. 12A and cross-sectional view 1202 of FIG. 12B illustrate alternative embodiments of the formation of a gate structure 214, a source contact 216s, and a drain contact 216d over the substrate 312 and within the first HEMT device region (902 of FIG. 11), the second HEMT device region (904 of FIG. 11), and the diode-connected HEMT device region (906 of FIG. 11). The gate structure 214, the source contact 216s, and the drain contact 216d define: a first gate $G_1$, a first source $S_1$, and a first drain $D_1$ of a first HEMT device 104; a second gate $G_2$, a second source $S_2$, and a second drain $D_2$ of a second HEMT device 108; and a third gate $G_3$, a third source $S_3$, and a third drain $D_3$ of a diode-connected transistor 110.

In some embodiments, shown in cross-sectional view 1200 of FIG. 12A, the gate structure 214 within the first HEMT device 104, the second HEMT device 108, and the diode-connected transistor 110 may be formed by depositing a lower gate layer over the active layer 316. In some embodiments, the lower gate layer may comprise a dielectric material (e.g., an oxide a nitride, or the like) or a semiconductor material (e.g., p-doped GaN). The lower gate layer is patterned to define a lower gate portion 214a of the gate structure 214. A conductive layer is formed over the lower gate portion 214a and the active layer 316. The conductive layer is patterned to define a gate electrode 214b, the source contacts 216s, and the drain contacts 216d. In some embodiments, the lower gate layer and the conductive layer may be patterned by forming photoresist layers over the lower gate layer and the conductive layer, and subsequently etching the lower gate layer and the conductive layer in areas not covered by the photoresist layers. In such embodiments, the gate structure 214 may have a first height $h_1$ that is larger than a second height $h_2$ of the source contact 216s and the drain contact 216d. In some such embodiments, the lower gate portion 214a may laterally extend past outermost sidewalls of the gate electrode 214b.

In other embodiments, shown in cross-sectional view 1202 of FIG. 12B, the gate structure 214 within the first HEMT device 104, the second HEMT device 108, and the diode-connected transistor 110 may be formed by depositing a lower gate layer over the active layer 316 and a conductive layer over the lower gate layer. The lower gate layer and the conductive layer are subsequently patterned using a same masking layer (e.g., photoresist layer) to define a gate structure 214 having a lower gate portion 214a and a gate electrode 214b. A dielectric material 1204 is subsequently deposited over the active layer 316 and the gate structure 214. The dielectric material 1204 is selectively patterned to define openings in the dielectric material 1204. The openings are subsequently filled with a conductive material followed by a planarization process that defines the source contact 216s and the drain contact 216d. In such embodiments, the gate structure 214 may have a first height $h_1$ that is smaller than a second height $h_2$ of the source contact 216s and the drain contact 216d. In some such embodiments, sidewalls of the lower gate portion 214a and the gate electrode 214b may be substantially aligned.

Figure 13:
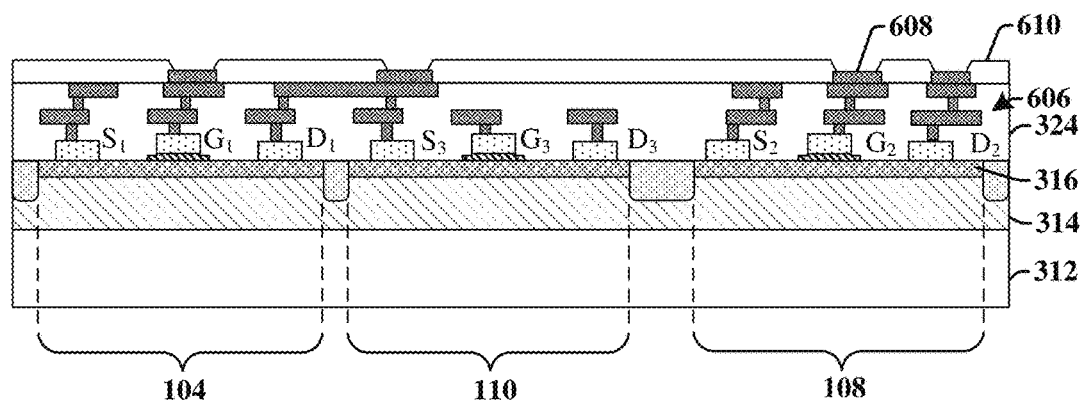

As shown in cross-sectional view 1300 of FIG. 13, one or more conductive interconnect layers 606 are formed within a dielectric structure 324 formed over the active layer 316. In some embodiments (not shown), the one or more conductive interconnect layers 606 are configured to electrically couple the first gate $G_1$ of the first HEMT device 104 to the third source $S_3$ and the third gate $G_3$ of the diode-connected transistor 110. In other embodiments, the one or more conductive interconnect layers 606 are configured to electrically couple the first source $S_1$ of the first HEMT device 104 to the third source $S_3$ and the third gate $G_3$ of the diode-connected transistor 110.

In some embodiments, the dielectric structure 324 may comprise a plurality of stacked ILD layers separated by a plurality of etch stop layers. In some embodiments, the plurality of conductive interconnect layers 606 may comprise alternating layers of interconnect wires and interconnect vias. In some embodiments, the plurality of conductive interconnect layers 606 may respectively be formed by way of a damascene process. In such embodiments, an ILD layer is formed over the active layer 316. The ILD layer is subsequently etched to form a via hole and/or trench, which is filled with a conductive material (e.g., tungsten, copper, and/or aluminum). A chemical mechanical planarization (CMP) process is subsequently performed to remove excess of the conductive material from over the ILD layer.

In some embodiments, bond pads 608 may be formed on the one or more conductive interconnect layers 606 and/or the dielectric structure 324. A passivation layer 610 may be subsequently formed over the bond pads 608. The bond pads 608 may be formed by depositing a conductive layer over the one or more conductive interconnect layers 606 and the dielectric structure 324, and subsequently patterning the conductive layer to define the bond pads 608. The passivation layer 610 may be formed by a deposition process followed by a patterning process.

Figure 14:
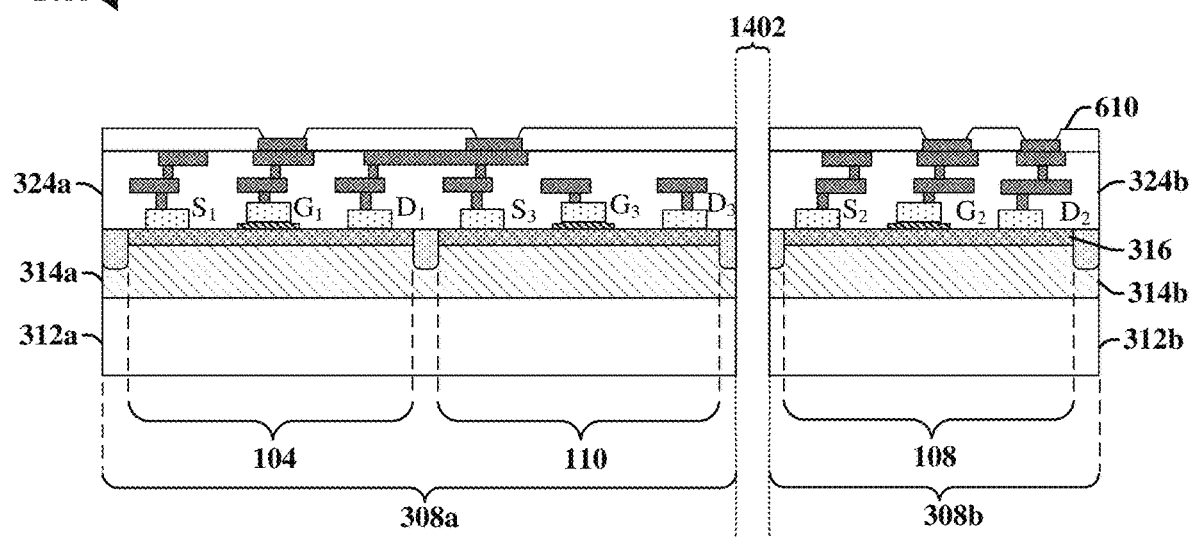

As shown in cross-sectional view 1400 of FIG. 14, the substrate 312 is diced along one or more of scribe lines 1402 to form a first die 308a and a second die 308b. The first die 308a comprises the first HEMT device 104 and the diode-connected transistor 110. The second die 308b comprises the second HEMT device 108. Although the first die 308a and the second die 308b are illustrated as being from a same substrate, it will be appreciated that in alternative embodiments, the first die 308a and the second die 308b may be formed in different substrates. For example, in some embodiments, the first die 308a is formed in a first wafer and the second die is formed in a second wafer that is different than the first wafer.

Figure 15:
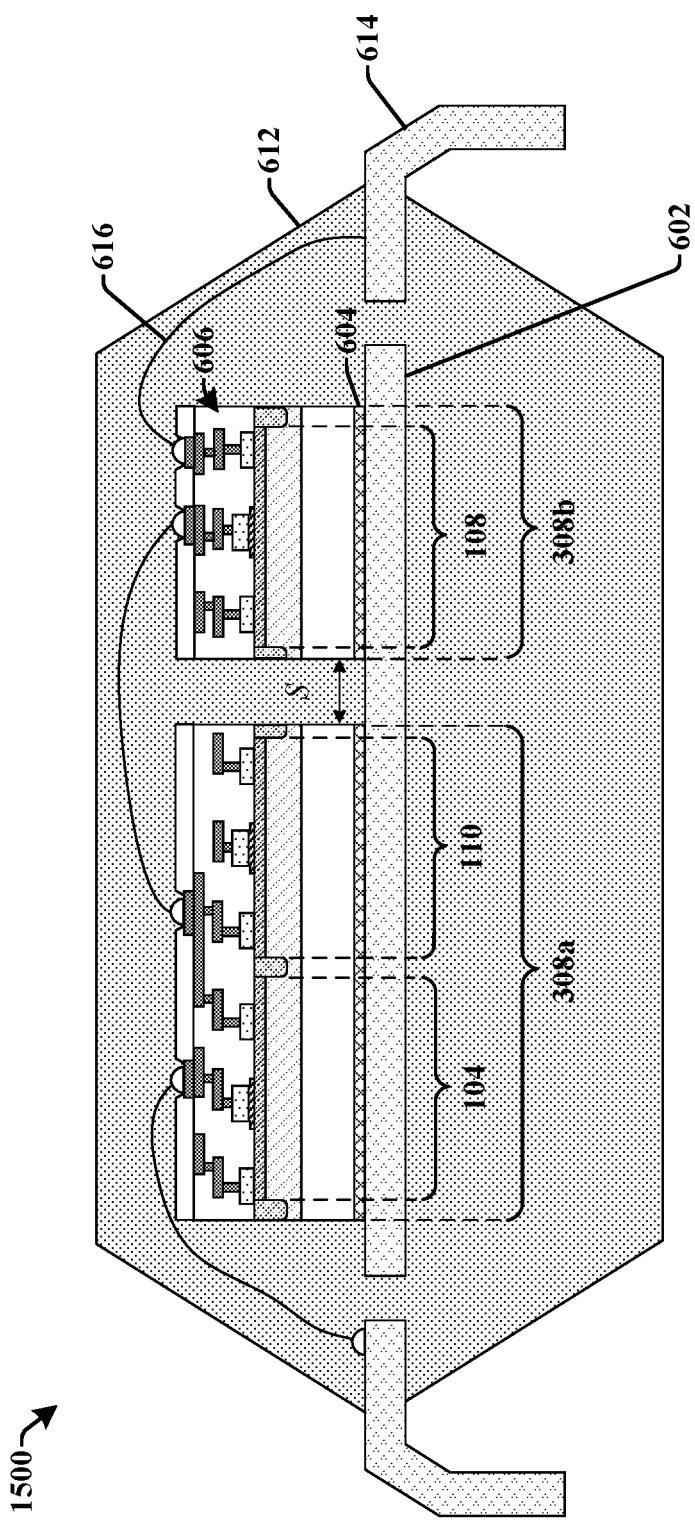

As shown in cross-sectional view 1500 of FIG. 15, the first die 308a and the second die 308b are placed within a package. In some embodiments, the first die 308a and the second die 308b may be bonded to a die pad 602 by way of an adhesive layer 604. The first die 308a is subsequently wire bonded to the second die 308b and to a plurality of lead frames 614 by way of one or more bond wires 616. A molding compound 612 is subsequently formed around the first die 308a, the second die 308b, the die pad 602, and the plurality of lead frames 614.

In some embodiments (not shown), the one or more bond wires 616 are configured to electrically couple a first drain $D_1$ of the first HEMT device 104 to a second source $S_2$ of the second HEMT device 108 and to further couple the second gate $G_2$ of the second HEMT device 108 to a third drain $D_3$ of the diode-connected transistor 110. The electrical connections of the one or more conductive interconnect layers 606 and the one or more bond wires 616 cause the first HEMT device 104, the second HEMT device 108, and the diode-connected transistor 110 to act as a single high voltage device having a common source terminal, a common drain terminal, and a common gate terminal (shown in FIG. 2). The high voltage device has a breakdown voltage that is greater than that of either the first HEMT device 104 or the second HEMT device 108.

FIGS. 16-23 illustrates cross-sectional views 1600-2300 of some alternative embodiments of method of forming a high voltage device comprising a cascode structure having a plurality of HEMT devices. Although the cross-sectional views 1600-2300 shown in FIGS. 16-23 are described with reference to a method of forming a cascode structure having a plurality of HEMT devices, it will be appreciated that the structures shown in FIGS. 16-23 are not limited to the method of formation but rather may stand alone separate of the method.

Figure 16:
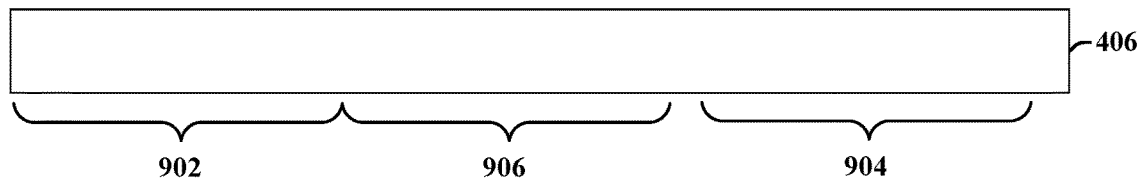
FIGS. 16-25 illustrate cross-sectional views of some alternative embodiments of method of forming a high voltage device comprising a cascode structure having a plurality of HEMT devices.

As shown in cross-sectional view 1600 of FIG. 16, a substrate 406 is provided. The substrate 406 comprises a semiconductor material having a first doping type (e.g., a p-type dopant). In various embodiments, the substrate 406 may be any type of semiconductor body (e.g., silicon, SiGe, SOI, etc.), as well as any other type of semiconductor, epitaxial, dielectric, or metal layers, associated therewith. The substrate 406 comprises a first HEMT device region 902, a second HEMT device region 904, and a diode-connected HEMT device region 906.

Figure 17:
Figure 17:
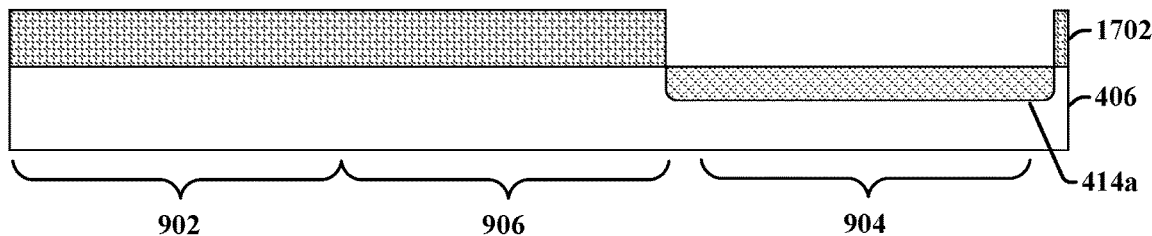

As shown in cross-sectional view 1700 of FIG. 17, a horizontally extending isolation region 414a is formed within the substrate 406. The horizontally extending isolation region 414a comprises a doped region having a second doping type that is different than the first doping type of the substrate 406. In some embodiments, the horizontally extending isolation region 414a may be formed by forming a first masking layer 1702 over the substrate 406 and subsequently implanting one or more first dopant species 1704 into the substrate 406 according to the first masking layer 1702. In some embodiments, the first masking layer 1702 may comprise photoresist, for example.

Figure 18:
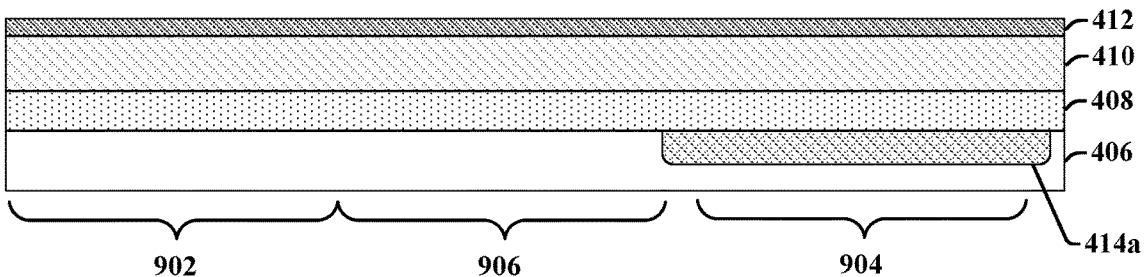

As shown in cross-sectional view 1800 of FIG. 18, an epitaxial buffer layer 408 is formed over the substrate 406 and the horizontally extending isolation region 414a. The epitaxial buffer layer 408 is configured to provide a consistent crystalline lattice, which prevents crystalline damage of the horizontally extending isolation region 414a from propagating to overlying layers. In some embodiments, the epitaxial buffer layer 408 may comprise a semiconductor material, such as silicon. In some embodiments, the epitaxial buffer layer 408 may comprise a same material as the underlying substrate 406.

A channel layer 410 is formed over the epitaxial buffer layer 408, and an active layer 412 is formed over the channel layer 410. The channel layer 410 comprises a different material than the active layer 412. For example, in some embodiments, the channel layer 410 may comprise gallium nitride (GaN) and the active layer 412 may comprise aluminum gallium nitride (AlGaN). In various embodiments, the channel layer 410 and/or the active layer 412 may be formed by way of deposition processes (e.g., chemical vapor deposition (CVD), plasma enhanced chemical vapor deposition (PE-CVD), atomic layer deposition (ALD), physical vapor deposition (PVD), etc.). In some embodiments, the channel layer 410 may be formed to a thickness that is less than or equal to approximately 5 microns, to provide for a high quality channel layer at a relatively low cost. In other embodiments, the channel layer 410 may be formed to a thickness that is less than or equal to approximately 10 microns. In yet other embodiments, the channel layer 410 may be formed to a thickness that is between approximately 5 microns and approximately 10 microns.

Figure 19:
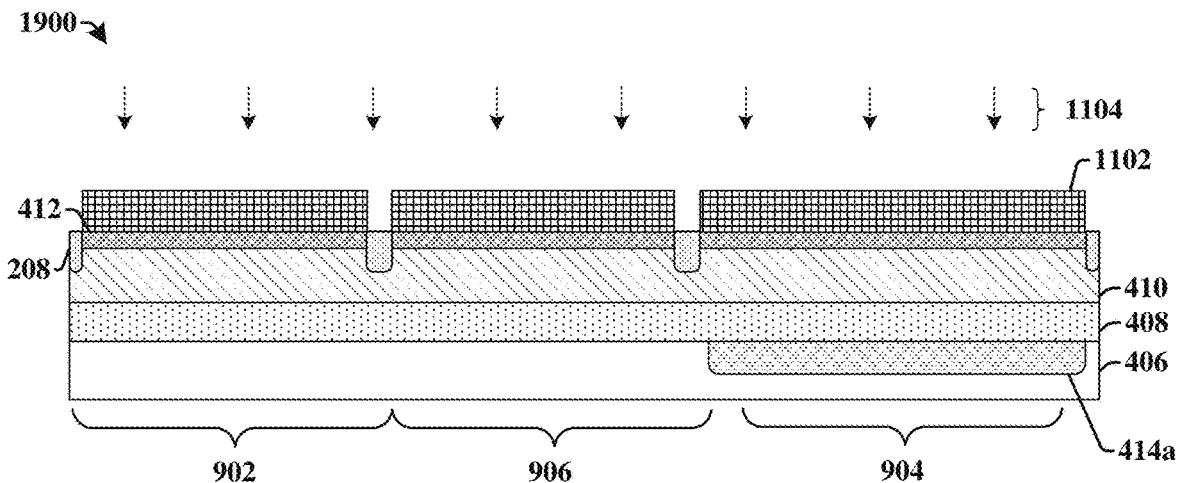

As shown in cross-sectional view 1900 of FIG. 19, a plurality of first isolation regions 208 are formed within the active layer 412. The plurality of first isolation regions 208 may comprise doped regions that vertically extend from a top of the active layer 412 to within the channel layer 410. The plurality of first isolation regions 208 are laterally positioned between the first HEMT device region 902, the second HEMT device region 904, and the diode-connected HEMT device region 906.

In some embodiments, the plurality of first isolation regions 208 are formed by forming a first patterned masking layer 1102 over the active layer 412 and subsequently implanting one or more dopant species 1104 into the active layer 412 according to the first patterned masking layer 1102. In some embodiments, the dopant species 1104 may be implanted with an energy that is sufficient to drive the dopant species 1104 into the channel layer 410. In some embodiments, a drive-in anneal may be performed to diffuse the dopant species after the implantation.

Figure 20:
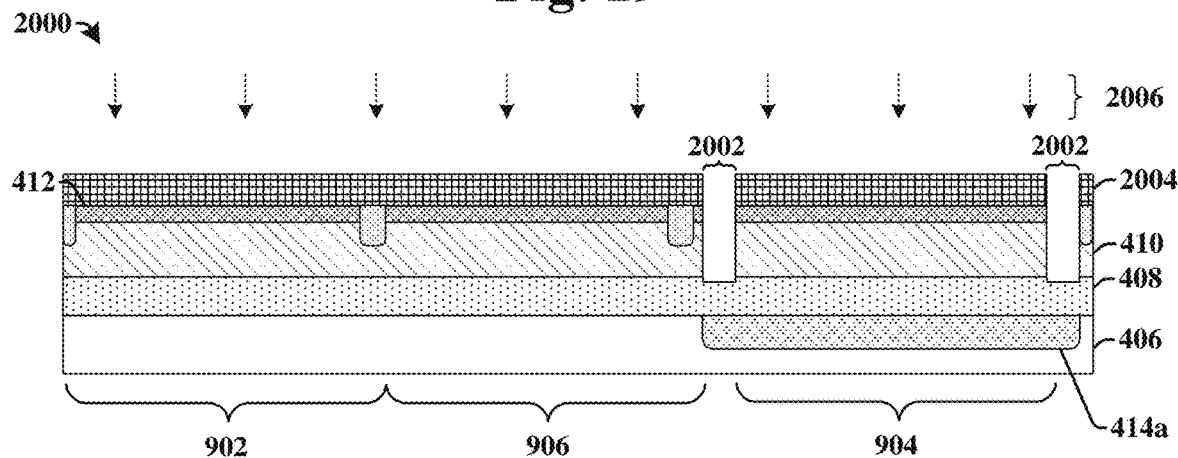

As shown in cross-sectional view 2000 of FIG. 20, the channel layer 410 and the active layer 412 are selectively etched to define trenches 2002 extending through the channel layer 410 and the active layer 412. The trenches 2002 vertically extend from a top of the active layer 412 to the epitaxial buffer layer 408. In some embodiments, the trenches 2002 may extend into the epitaxial buffer layer 408, so that sidewalls of the trenches 2002 are respectively defined by the epitaxial buffer layer 408, the channel layer 410, and the active layer 412. In some embodiments, the channel layer 410 and the active layer 412 may be selectively etched by forming a second patterned masking layer 2004 over the active layer 412 and subsequently exposing the channel layer 410 and the active layer 412 to one or more etchants 2006 in areas not covered by the second patterned masking layer 2004.

Figure 21:
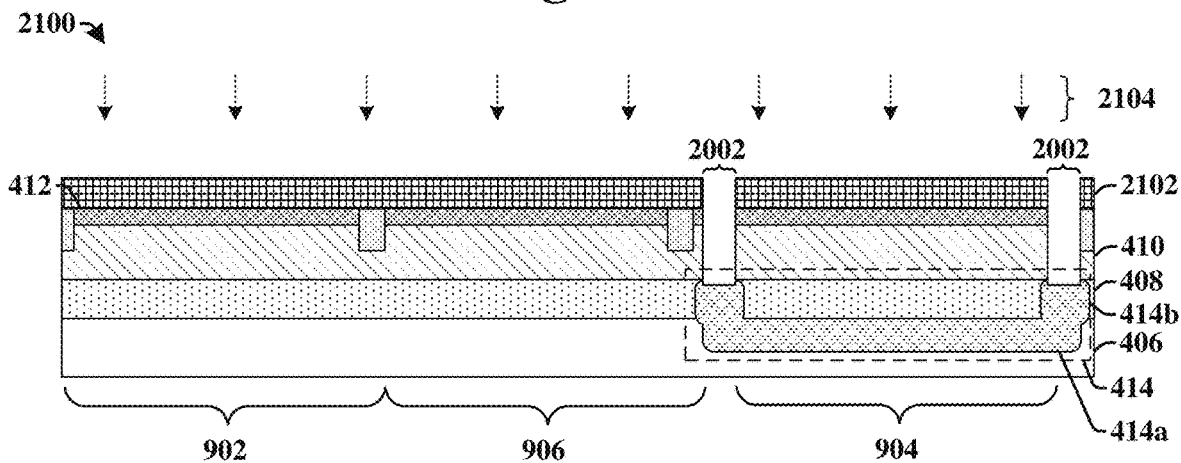

As shown in cross-sectional view 2100 of FIG. 21, one or more vertically extending isolation regions 414b are formed within the epitaxial buffer layer 408 over the horizontally extending isolation region 414a. The one or more vertically extending isolation regions 414b comprise doped regions having the second doping type. The horizontally extending isolation region 414a and the one or more vertically extending isolation regions 414b collective define an isolation structure 414 that is configured to electrically isolate the second HEMT device region 904 from the first HEMT device region 902 and the diode-connected HEMT device region 906.

In some embodiments, the one or more vertically extending isolation regions 414b may be formed by selectively implanting one or more second dopant species 2104 into the epitaxial buffer layer 408 according to a third patterned masking layer 2102. In some embodiments, the one or more second dopant species 2104 may be the same as the one or more first dopant species (1704 of FIG. 17) used to form the horizontally extending isolation region 414a. In some embodiments, the third patterned masking layer 2102 may comprise the second patterned masking layer 2004 used to define trenches 2002. In some embodiments, the one or more vertically extending isolation regions 414b may laterally extend past an outer side of the horizontally extending isolation region 414a. In some additional embodiments, the one or more vertically extending isolation regions 414b may vertically extend below a top of the horizontally extending isolation region 414a. In such embodiments, the one or more vertically extending isolation regions 414b may contact the horizontally extending isolation region 414a along a first direction and along a second direction perpendicular to the first direction.

Figure 22:
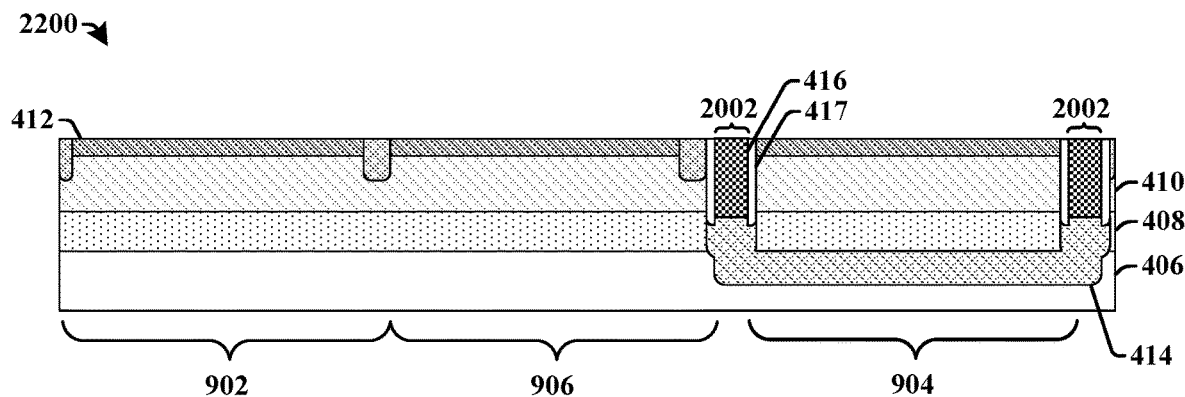

As shown in cross-sectional view 2200 of FIG. 22, a conductive material is formed within the trenches 2002 to define conductive contacts 416. The conductive contacts 416 vertically extend through the channel layer 410 and the active layer 412 to contact the isolation structure 414. In some embodiments, an insulating layer 417 comprising one or more dielectric materials may be formed along sidewalls of the trenches 2002 prior to the formation of the conductive material. In some embodiments, the insulating layer 417 may be formed by performing a thermal oxidation process with the third patterned masking layer (2102 of FIG. 21) in place. The thermal oxidation process forms an insulating layer (e.g., an oxide) on exposed surfaces of the epitaxial buffer layer 408, the channel layer 410, and/or the active layer 412. An etching process may be subsequently performed to remove the insulating layer from an upper surface of the epitaxial buffer layer 408. In some such embodiments, the insulating layer 417 may comprise a first dielectric material contacting the epitaxial buffer layer 408, a second dielectric material contacting the channel layer 410, and a third dielectric material contacting the active layer 412.

Figure 23:
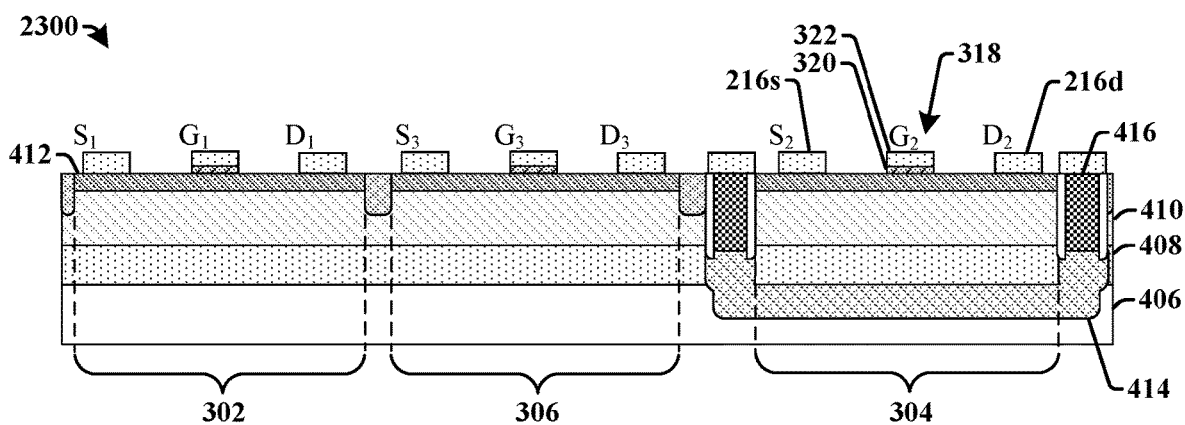

As shown in cross-sectional view 2300 of FIG. 23, a gate structure 318, a source contact 216s, and a drain contact 216d are formed over the active layer 412 within the first HEMT device region (902 of FIG. 21), a second HEMT device region (904 of FIG. 21), and a diode-connected HEMT device region (906 of FIG. 21). The gate structure 318, the source contact 216s, and the drain contact 216d define: a first gate $G_1$, a first source $S_1$, and a first drain $D_1$ of a first HEMT device 302; a second gate $G_2$, a second source $S_2$, and a second drain $D_2$ of a second HEMT device 304; and a third gate $G_3$, a third source $S_3$, and a third drain $D_3$ of a diode-connected HEMT device 306. In some embodiments, the gate structure 318 may comprise a doped layer of semiconductor material 320 and a gate electrode 322 disposed over the doped layer of semiconductor material 320.

Figure 24:
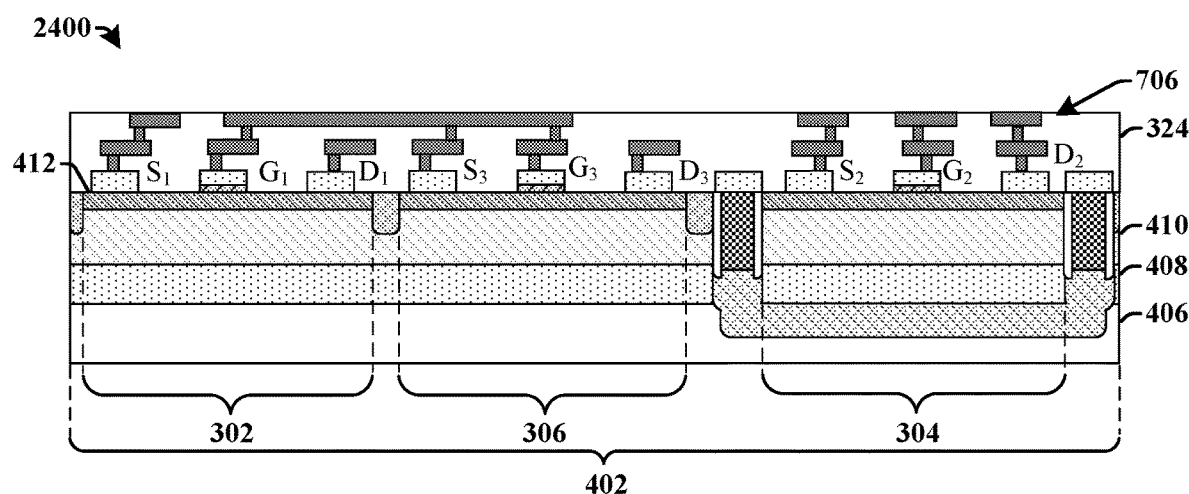

As shown in cross-sectional view 2400 of FIG. 24, a plurality of conductive interconnect layers 706 are formed within a dielectric structure 324 formed over the active layer 412. In some embodiments, the dielectric structure 324 may comprise a plurality of stacked ILD layers separated by a plurality of etch stop layers. In some embodiments, the plurality of conductive interconnect layers 706 may comprise alternating layers of interconnect wires and interconnect vias.

In some embodiments (not shown), the plurality of conductive interconnect layers 706 are configured to electrically couple the first gate $G_1$ of the first HEMT device 302 to the third source $S_3$ and the third gate $G_3$ of the diode-connected HEMT device 306, the first drain $D_1$ of the first HEMT device 302 to the second source $S_2$ of the second HEMT device 304 and to further couple the second gate $G_2$ of the second HEMT device 304 to the third drain $D_3$ of the diode-connected HEMT device 306. The electrical connections of the plurality of conductive interconnect layers 706 cause the first HEMT device 302, the second HEMT device 304, and the diode-connected HEMT device 306 to act as a single high voltage device having a common source terminal, a common drain terminal, and a common gate terminal (shown in FIG. 2). The high voltage device has a breakdown voltage that is greater than that of either the first HEMT device 302 or the second HEMT device 304.

Figure 25:
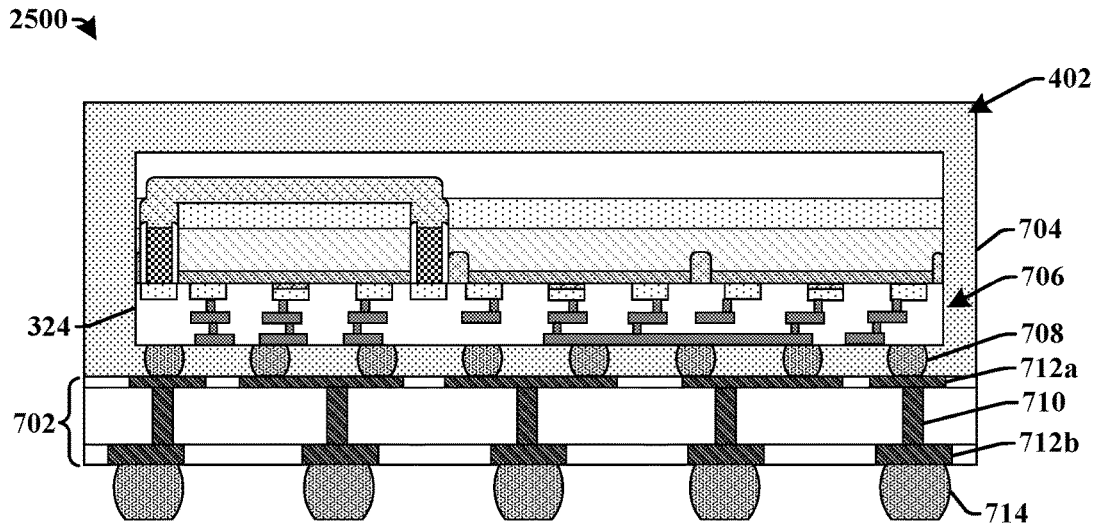

As shown in cross-sectional view 2500 of FIG. 25, the die 402 is placed within a package. In some embodiments, the die 402 may be bonded to a carrier substrate 702 by way of one or more micro-bumps 708. A molding compound 704 is subsequently formed over the carrier substrate 702 and the die 402.

Figure 26:
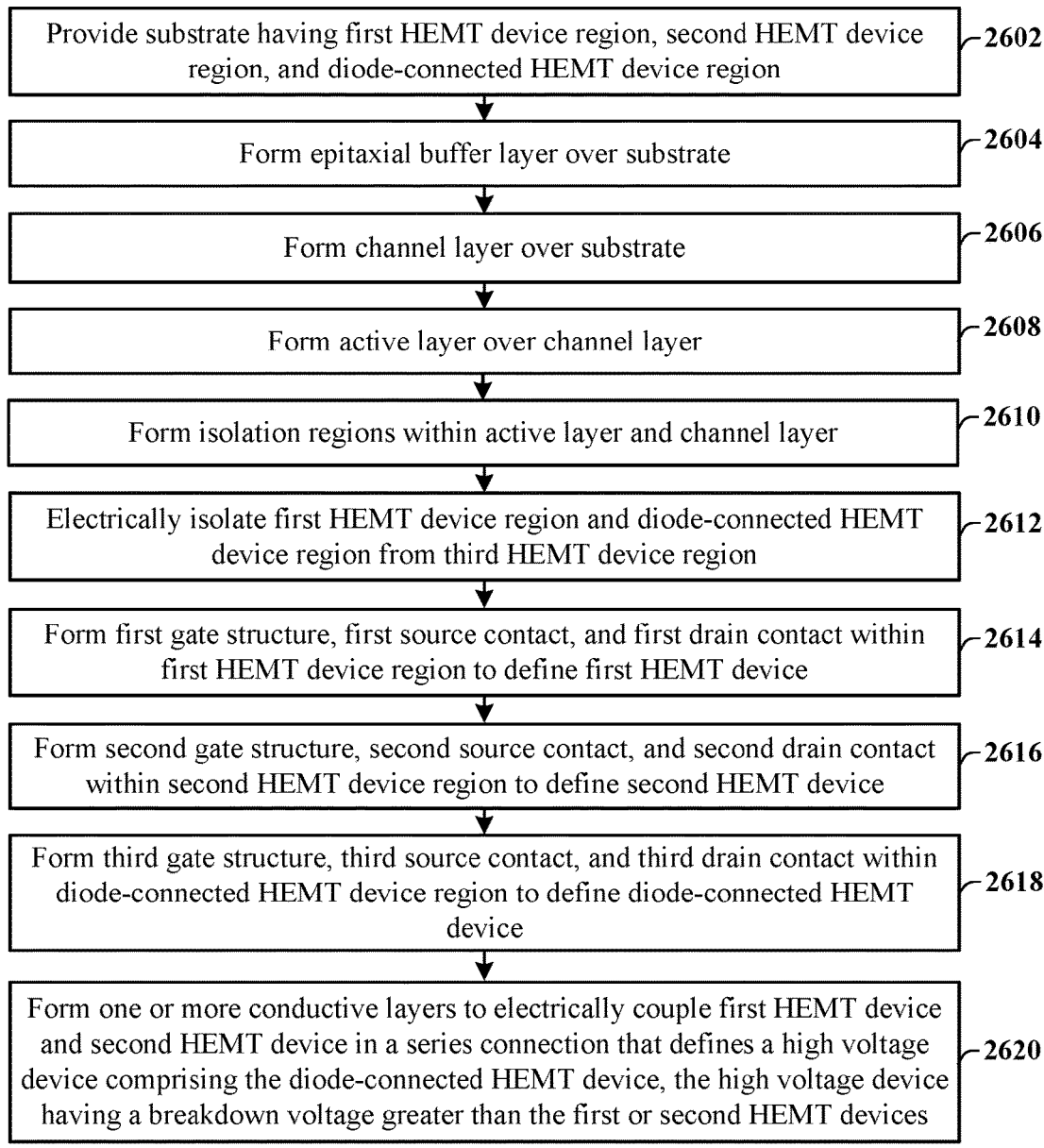
FIG. 26 illustrates a flow diagram of some embodiments of a method of forming a high voltage device comprising a cascode structure having a plurality of HEMT devices.

FIG. 26 illustrates a flow diagram of some embodiments of a method 2600 of forming a high voltage device comprising a cascode structure having a plurality of HEMT devices.

While method 2600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2602, a substrate is provided having a first HEMT device region, a second HEMT device region, and a diode-connected HEMT device region. FIGS. 9 and 16 illustrate cross-sectional views, 900 and 1600, of some embodiments corresponding to act 2602.

At 2604, an epitaxial buffer layer may be formed over the substrate in some embodiments. FIG. 18 illustrates a cross-sectional view 1800 of some embodiments corresponding to act 2604.

At 2606, a channel layer is formed over the substrate. FIGS. 10 and 18 illustrate cross-sectional views, 1000 and 1800, of some embodiments corresponding to act 2606.

At 2608, an active layer is formed over the substrate. FIGS. 10 and 18 illustrate cross-sectional views, 1000 and 1800, of some embodiments corresponding to act 2608.

At 2610, isolation regions are formed within the active layer and the channel layer between the first HEMT device region, the second HEMT device region, and the diode-connected HEMT device region. FIGS. 11 and 19 illustrate cross-sectional views, 1100 and 1900, of some embodiments corresponding to act 2610.

At 2612, the first HEMT device region and the diode-connected HEMT device region are electrically isolated from the second HEMT device region. FIG. 14 and FIGS. 17 and 20-22 illustrate cross-sectional views of some embodiments corresponding to act 2612.

At 2614, a first gate structure, a first source contact, and a first drain contact are formed within the first HEMT device region to define a first HEMT device. FIGS. 12A, 12B, and 23 illustrate cross-sectional views, 1200, 1202, and 2300, of some embodiments corresponding to act 2614.

At 2616, a second gate structure, a second source contact, and a second drain contact are formed within the second HEMT device region to define a second HEMT device. FIGS. 12A, 12B, and 23 illustrate cross-sectional views, 1200, 1202, and 2300, of some embodiments corresponding to act 2616.

At 2618, a third gate structure, a third source contact, and a third drain contact are formed within the diode-connected HEMT device region to define a diode-connected HEMT device. FIGS. 12A, 12B, and 23 illustrate cross-sectional views, 1200, 1202, and 2300, of some embodiments corresponding to act 2618.

At 2620, one or more conductive layers are formed to electrically couple the first HEMT device and the second HEMT device in a series connection that defines a high voltage device comprising the diode-connected HEMT device. The high voltage device has a breakdown voltage that is greater than breakdown voltages of the first HEMT device or the second HEMT device. FIGS. 13 and 15 and FIGS. 24-25 illustrate cross-sectional views of some embodiments corresponding to act 2620.

Accordingly, the present disclosure relates to a high voltage device comprising a first HEMT device connected in series with a second HEMT device, so as to collectively operate as equivalent to a single high voltage transistor device having a relatively large breakdown voltage (i.e., a breakdown voltage that is larger than breakdown voltages of either the first HEMT or the second HEMT device).

In some embodiments, the present disclosure relates to a semiconductor device. The semiconductor device includes a first high electron mobility transistor (HEMT) device disposed within a semiconductor structure and having a first source, a first drain, and a first gate; a second HEMT device disposed within the semiconductor structure and having a second source coupled to the first drain, a second drain, and a second gate; and a diode-connected transistor device disposed within the semiconductor structure and having a third source, a third gate, and a third drain coupled to the second gate. In some embodiments, the first HEMT device is a first enhancement mode HEMT device. In some embodiments, the second HEMT device is a second enhancement mode HEMT device, and the third source is coupled to the first gate and the third drain is coupled to the second gate. In some embodiments, the second HEMT device is a depletion mode HEMT device, and the third source is coupled to the first source and the third drain is coupled to the second gate. In some embodiments, the first HEMT device and the diode-connected transistor device are arranged within a first die, and the second HEMT device is arranged within a second die that has an outermost sidewall that is separated from an outermost sidewall of the first die by a non-zero distance. In some embodiments, the first die and the second die respectively include a substrate having a first semiconductor material; a channel layer positioned over the substrate and having a second semiconductor material; and an active layer positioned over the channel layer and having a third semiconductor material. In some embodiments, the first die and the second die respectively include a layer of gallium nitride arranged over a silicon substrate; and a layer of aluminum gallium nitride arranged on the layer of gallium nitride. In some embodiments, the layer of gallium nitride has a thickness that is less than or equal to approximately 10 microns. In some embodiments, the first HEMT device, the diode-connected transistor device, and the second HEMT device are arranged within a die. In some embodiments, the die includes a substrate including silicon having a first doping type; a layer of gallium nitride arranged over the substrate; and a layer of aluminum gallium nitride contacting a top of the layer of gallium nitride. In some embodiments, the die includes a substrate having a first semiconductor material with a first doping type; an epitaxial buffer layer disposed over the substrate and having the first semiconductor material having the first doping type; a channel layer positioned over the epitaxial buffer layer and having a second semiconductor material; and an active layer positioned over the channel layer and having a third semiconductor material. In some embodiments, the semiconductor device further includes an isolation structure having a doped region with a second doping type different than the first doping type, the doped region including a horizontally extending segment disposed within the substrate and vertically extending segments protruding outward form a top of the horizontally extending segment. In some embodiments, the semiconductor device further includes one or more conductive contacts extending through the channel layer and the active layer to contact the isolation structure. In some embodiments, the one or more conductive contacts physically contact the isolation structure at an interface disposed along a horizontal plane extending along a top surface of the epitaxial buffer layer.

In other embodiments, the present disclosure relates to a high voltage device. The high voltage device includes a semiconductor structure having a substrate, a channel layer over the substrate, and an active layer over the channel layer; a first high electron mobility transistor (HEMT) device having a first source, a first drain, and a first gate disposed over the active layer; a second HEMT device having a second source, a second drain, and a second gate disposed over the active layer; a diode-connected transistor device having a third source, a third drain, and a third gate disposed over the active layer; and one or more conductive layers disposed over the semiconductor structure and configured to electrically couple the first drain to the second source and the third drain to the second gate. In some embodiments, the first HEMT device and the diode-connected transistor device are arranged within a first die, and the second HEMT device is arranged within a second die that is separated from the first die by a non-zero distance. In some embodiments, the substrate continuously extends below the first HEMT device, the diode-connected transistor device, and the second HEMT device. In some embodiments, the high voltage device further includes an isolation structure having a doped region disposed within the substrate and having a doping type different than the substrate, the doped region including a horizontally extending segment laterally between a first vertically extending segment protruding outward form a top of the horizontally extending segment and a second vertically extending segment protruding outward form the top of the horizontally extending segment.

In yet other embodiments, the present disclosure relates to a method of forming an integrated chip. The method includes forming a channel layer having a second semiconductor material over a substrate having a first semiconductor material; forming an active layer having a third semiconductor material over the channel layer; forming a first gate structure, a first source contact, and a first drain contact over the active layer to define a first high electron mobility transistor (HEMT) device; forming a second gate structure, a second source contact, and a second drain contact over the active layer to define a second HEMT device; and forming one or more conductive layers over the active layer to electrically couple the first HEMT device and the second HEMT device in a series connection that defines a high voltage device having a breakdown voltage that is greater than breakdown voltages of the first HEMT device or the second HEMT device. In some embodiments, the method further includes selectively implanting a first dopant species into the substrate to form a horizontally extending isolation region within the substrate; forming an epitaxial buffer layer on the substrate after implanting the first dopant species and prior to forming the channel layer; selectively patterning the active layer and the channel layer to define trenches extending through the active layer and the channel layer to the epitaxial buffer layer; and implanting the epitaxial buffer layer to form one or more vertically extending isolation regions contacting the horizontally extending isolation region, the one or more vertically extending isolation regions disposed on opposing sides of the second HEMT device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first high electron mobility transistor (HEMT) device disposed within a semiconductor structure and comprising a first source, a first drain, and a first gate;
a second HEMT device disposed within the semiconductor structure and comprising a second source coupled to the first drain, a second drain, and a second gate; and
a diode-connected transistor device disposed within the semiconductor structure and comprising a third source, a third gate, and a third drain coupled to the second gate.

2. The semiconductor device of claim 1, wherein the first HEMT device is a first enhancement mode HEMT device.

3. The semiconductor device of claim 2,
wherein the second HEMT device is a second enhancement mode HEMT device; and
wherein the third source is coupled to the first gate.

4. The semiconductor device of claim 1,
wherein the first HEMT device and the diode-connected transistor device are arranged within a first die; and
wherein the second HEMT device is arranged within a second die that has an outermost sidewall that is separated from an outermost sidewall of the first die by a non-zero distance.

5. The semiconductor device of claim 4, wherein the first die and the second die respectively comprise:
a substrate comprising a first semiconductor material;
a channel layer positioned over the substrate and comprising a second semiconductor material; and
an active layer positioned over the channel layer and comprising a third semiconductor material.

6. The semiconductor device of claim 4, wherein the first die and the second die respectively comprise:
a layer of gallium nitride arranged over a silicon substrate; and
a layer of aluminum gallium nitride arranged on the layer of gallium nitride.

7. The semiconductor device of claim 6, wherein the layer of gallium nitride has a thickness that is between approximately 5 microns and approximately 10 microns.

8. The semiconductor device of claim 1, wherein the first HEMT device, the diode-connected transistor device, and the second HEMT device are arranged within a die.

9. The semiconductor device of claim 8, wherein the die comprises:
a substrate comprising silicon having a first doping type;
a layer of gallium nitride arranged over the substrate; and
a layer of aluminum gallium nitride contacting a top of the layer of gallium nitride.

10. The semiconductor device of claim 8, wherein the die comprises:
a substrate comprising a first semiconductor material having a first doping type;
an epitaxial buffer layer disposed over the substrate and comprising the first semiconductor material having the first doping type;
a channel layer positioned over the epitaxial buffer layer and comprising a second semiconductor material; and
an active layer positioned over the channel layer and comprising a third semiconductor material.

11. The semiconductor device of claim 10, further comprising:
an isolation structure comprising a doped region having a second doping type different than the first doping type, the doped region comprising a horizontally extending segment disposed within the substrate and vertically extending segments protruding outward from a top of the horizontally extending segment.

12. The semiconductor device of claim 11, further comprising:
one or more conductive contacts extending through the channel layer and the active layer to contact the isolation structure.

13. The semiconductor device of claim 12, wherein the one or more conductive contacts physically contact the isolation structure at an interface disposed along a horizontal plane extending along a top surface of the epitaxial buffer layer.

14. The semiconductor device of claim 12, wherein the one or more conductive contacts are laterally separated from the channel layer and the active layer by an insulating layer.

15. A high voltage device, comprising:
a semiconductor structure comprising a substrate, a channel layer over the substrate, and an active layer over the channel layer;
a first high electron mobility transistor (HEMT) device comprising a first source, a first drain, and a first gate disposed over the active layer;
a second HEMT device comprising a second source, a second drain, and a second gate disposed over the active layer;
a diode-connected transistor device comprising a third source, a third drain, and a third gate disposed over the active layer; and
one or more conductive layers disposed over the semiconductor structure and configured to electrically couple the first drain to the second source and the third drain to the second gate.

16. The high voltage device of claim 15,
wherein the first HEMT device and the diode-connected transistor device are arranged within a first die; and
wherein the second HEMT device is arranged within a second die that is separated from the first die by a non-zero distance.

17. The high voltage device of claim 15, wherein the substrate continuously extends below the first HEMT device, the diode-connected transistor device, and the second HEMT device.

18. The high voltage device of claim 17, further comprising:
an isolation structure comprising a doped region disposed within the substrate and having a doping type different than the substrate, wherein the doped region comprises a horizontally extending segment laterally between a first vertically extending segment protruding outward from a top of the horizontally extending segment and a second vertically extending segment protruding outward from the top of the horizontally extending segment.

19. A method of forming a high voltage device, comprising:
forming a channel layer comprising a second semiconductor material over a substrate comprising a first semiconductor material;

forming an active layer comprising a third semiconductor material over the channel layer;

forming a first gate structure, a first source contact, and a first drain contact over the active layer to define a first high electron mobility transistor (HEMT) device;

forming a second gate structure, a second source contact, and a second drain contact over the active layer to define a second HEMT device; and forming a third gate structure, a third source contact, and a third drain contact over the active layer to define a diode-connected transistor device; and forming one or more conductive layers over the active layer, wherein the one or more conductive layers are configured to electrically couple the first drain contact to the second source contact and the third drain contact to the second gate structure.

20. The method of claim 19, further comprising:

selectively implanting a first dopant species into the substrate to form a horizontally extending isolation region within the substrate;

forming an epitaxial buffer layer on the substrate after implanting the first dopant species and prior to forming the channel layer;

selectively patterning the active layer and the channel layer to define trenches extending through the active layer and the channel layer to the epitaxial buffer layer; and implanting a second dopant species into the epitaxial buffer layer to form one or more vertically extending isolation regions contacting the horizontally extending isolation region, the one or more vertically extending isolation regions disposed on opposing sides of the second HEMT device.

* * * * *